(12) United States Patent
Yang et al.

(10) Patent No.: US 11,862,287 B2
(45) Date of Patent: Jan. 2, 2024

(54) MANAGING PAGE BUFFER CIRCUITS IN MEMORY DEVICES

(71) Applicant: Macronix International Co., Ltd., Hsinchu (TW)

(72) Inventors: Shang-Chi Yang, Changhua County (TW); Hui-Yao Kao, New Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 58 days.

(21) Appl. No.: 17/674,132

(22) Filed: Feb. 17, 2022

(65) Prior Publication Data

US 2023/0037585 A1 Feb. 9, 2023

Related U.S. Application Data

(60) Provisional application No. 63/230,067, filed on Aug. 6, 2021.

(51) Int. Cl.
G11C 7/10 (2006.01)
G11C 7/18 (2006.01)

(52) U.S. Cl.
CPC ............ *G11C 7/1057* (2013.01); *G11C 7/106* (2013.01); *G11C 7/1084* (2013.01); *G11C 7/1087* (2013.01); *G11C 7/18* (2013.01)

(58) Field of Classification Search
CPC ..... G11C 7/1057; G11C 7/106; G11C 7/1084; G11C 7/1087; G11C 7/18
See application file for complete search history.

(56) References Cited

U.S. PATENT DOCUMENTS

| 7,016,229 | B2 | 3/2006 | Kim |
| 7,505,322 | B2* | 3/2009 | Lee ................... G11C 16/3418 365/185.25 |
| 7,535,775 | B2 | 5/2009 | Kang et al. |
| 7,903,466 | B2 | 3/2011 | Wang et al. |
| 8,531,874 | B2* | 9/2013 | Lim ........................ G11C 7/12 365/158 |
| 9,786,335 | B2 | 10/2017 | Huh |
| 9,990,969 | B2 | 6/2018 | Yang |

(Continued)

FOREIGN PATENT DOCUMENTS

| TW | 200845001 | 11/2008 |
| TW | 201608571 | 3/2016 |
| TW | 201611028 | 3/2016 |

*Primary Examiner* — Vanthu T Nguyen
(74) *Attorney, Agent, or Firm* — Fish & Richardson P.C.

(57) ABSTRACT

Systems, methods, circuits, and apparatus including computer-readable mediums for managing page buffer circuits in memory devices are provided. In one aspect, a memory device includes a memory cell array, memory cell lines connecting respective lines of memory cells, and a page buffer circuit including page buffers coupled to the memory cell lines. Each page buffer includes a sensing latch circuit and a storage latch circuit. The sensing latch circuit includes a sensing transistor coupled to a sensing node and at least one sensing latch unit having a first node coupled to the sensing node and a second node coupled to a first terminal of the sensing transistor. The storage latch circuit includes at least one storage latch unit having third and fourth nodes coupled to the sensing node and a gate terminal of the sensing transistor. A second terminal of the sensing transistor is coupled to a ground.

20 Claims, 12 Drawing Sheets

(56) References Cited

U.S. PATENT DOCUMENTS

| | | |
|---|---|---|
| 2010/0309725 A1 | 12/2010 | Huh |
| 2015/0003151 A1 | 1/2015 | Lee |
| 2016/0099056 A1 | 4/2016 | Lee |
| 2017/0140823 A1 | 5/2017 | Missiroli et al. |
| 2017/0154658 A1 | 6/2017 | Komai |
| 2019/0019561 A1 | 1/2019 | Lee et al. |
| 2019/0237145 A1 | 8/2019 | Jo |

* cited by examiner

MANAGING PAGE BUFFER CIRCUITS IN MEMORY DEVICES

CROSS-REFERENCE TO RELATED APPLICATION

This application claims priority under 35 USC § 119(e) to U.S. Provisional Patent Application Ser. No. 63/230,067, entitled "A PAGE BUFFER CIRCUIT WITH GROUPED LATCH TO IMPROVE THE SENSING ACCURACY AND REDUCING THE AREA" and filed on Aug. 6, 2021, the entire content of which is hereby incorporated by reference.

BACKGROUND

Integrated circuit memory devices are becoming smaller and faster. One limitation on a size of a memory device arises from a size of a sensing capacitor in a page buffer circuit. To sense data stored in the memory device, the sensing capacitor needs to have a large capacitance, which normally requires a large area. Therefore, it would be desirable to develop a page buffer circuit that can provide a large and stable capacitance but with a small area.

SUMMARY

The present disclosure describes systems and techniques for managing page buffer circuits in memory devices, e.g., non-volatile memory devices such as flash memories.

One aspect of the present disclosure features a memory device including: a memory cell array including a plurality of memory cells; a plurality of memory cell lines connecting respective lines of memory cells in the memory cell array; and a page buffer circuit including a plurality of page buffers coupled to the plurality of memory cell lines. Each page buffer includes: a sensing latch circuit including a sensing transistor coupled to a sensing node and at least one sensing latch unit having a first node coupled to the sensing node and a second node coupled to the sensing transistor, and a storage latch circuit including at least one storage latch unit having third and fourth nodes coupled to the sensing node. The sensing transistor includes a first terminal coupled to the second node of the at least one sensing latch unit, a gate terminal coupled to the sensing node and the third and fourth nodes of the at least one storage latch unit, and a second terminal coupled to a ground.

In some embodiments, each of the at least one sensing latch unit includes: a first latch having a first pair of inverters; and a first latch control circuit coupled to the first latch and the first terminal of the sensing transistor. Each of the at least one storage latch unit includes: a second latch having a second pair of inverters, and a second latch control circuit coupled to the second latch and the gate terminal of the sensing transistor.

In some embodiments, the second latch control circuit includes a first control transistor and a second control transistor, and source terminals of the first control transistor and the second control transistor are coupled to the sensing node and the gate terminal of the sensing transistor.

In some embodiments, each of the at least one sensing latch unit further includes a first coupling circuit coupled to the sensing node and the first latch, and each of the at least one storage latch unit further includes a second coupling circuit coupled to the sensing node and the second latch.

In some embodiments, each page buffer further includes: a precharging circuit coupled to the sensing node and configured to precharge the sensing node during a precharging phase; and a bit line control circuit having a first control node coupled to a bit line for a memory cell and a second control node coupled to the sensing node. The bit line control circuit is configured to: precharge the bit line during the precharging phase and discharge the sensing node by conductively connecting the sensing node with the bit line to provide a sensing current to the memory cell during a discharging phase sequential to the precharging phase.

In some embodiments, the page buffer is configured such that the bit line is conductively disconnected to the sensing node during the precharging phase and the bit line is conductively connected to the sensing node during the discharging phase.

In some embodiments, the storage latch circuit is configured to: turn on one or more latch control circuits of the at least one storage latch unit to update a sensing result in one or more latches of the at least one storage latch unit.

In some embodiments, a number of the at least one sensing latch unit in the sensing latch circuit and a number of the at least one storage latch unit in the storage latch circuit are associated with a memory cell type of the memory cells.

In some embodiments, the number of the at least one storage latch unit in the storage latch circuit is determined based on a number of bits storable in the memory cell type.

In some embodiments, the sensing latch circuit and the storage latch circuit are configured such that: if the memory cell type of the memory cells is a single-level cell (SLC) type, the sensing latch circuit includes one sensing latch unit and the storage latch circuit includes one storage latch unit; if the memory cell type of the memory cells is a multi-level cell (MLC) type, the sensing latch circuit includes one sensing latch unit and the storage latch circuit includes two storage latch units; if the memory cell type of the memory cells is a triple-level cell (TLC) type, the sensing latch circuit includes two sensing latch units and the storage latch circuit includes three storage latch units; and if the memory cell type of the memory cells is a quad-level cell (QLC) type, the sensing latch circuit includes two sensing latch units and the storage latch circuit includes four storage latch units.

In some embodiments, the storage latch circuit includes no transistor substantially same as the sensing transistor.

In some embodiments, the sensing latch circuit includes one or more sensing transistors that each are substantially same as the sensing transistor, the sensing latch circuit includes a plurality of sensing latch units, and a number of the one or more sensing transistors is smaller than a number of the plurality of sensing latch units.

Another aspect of the present disclosure features an integrated circuit including: a sensing latch circuit that includes a sensing transistor coupled to a sensing node; at least one sensing latch unit having a first node coupled to a sensing node and a second node coupled to the sensing transistor; and a storage latch circuit having at least one storage latch unit having third and fourth nodes coupled to the sensing node. The sensing transistor includes: a first terminal coupled to the second node of the at least one sensing latch unit, a second terminal coupled to a ground, and a gate terminal coupled to the sensing node and the third and fourth nodes of the at least one storage latch unit.

In some embodiments, each of the at least one sensing latch unit includes: a first latch having a first pair of inverters; and a first latch control circuit coupled to the first latch and the first terminal of the sensing transistor, and each of the at least one storage latch unit includes: a second latch having a second pair of inverters; and a second latch control circuit coupled to the second latch and the gate terminal of the sensing transistor.

In some embodiments, the first latch control circuit includes a first transistor for receiving a setup signal and a second transistor for receiving a reset signal.

In some embodiments, each of the at least one sensing latch unit includes: a first coupling circuit coupled to the sensing node and the first latch. Each of the at least one storage latch unit includes: a second coupling circuit coupled to the sensing node and the second latch.

In some embodiments, the at least one sensing latch unit includes a plurality of sensing latch units, and each of the plurality of sensing latch units includes a respective first node coupled to the sensing node and a respective second node coupled to a drain terminal of the sensing transistor, and the at least one storage latch unit includes a plurality of storage latch units, and where each of the plurality of storage latch units includes a respective third node coupled to the sensing node and a respective fourth node coupled to the gate terminal of the sensing transistor.

In some embodiments, the sensing latch circuit includes at least one sensing transistor, and the at least one storage latch unit includes no transistor substantially same as the sensing transistor.

In some embodiments, the sensing latch circuit and the storage latch circuit are configured to have an equivalent capacitor that is associated with a gate capacitor associated with the sensing transistor and one or more junction capacitors associated with transistors in the sensing latch circuit and the storage latch circuit.

In some embodiments, the equivalent capacitor is associated with one or more metal routing lines in the sensing latch circuit and the storage latch circuit.

In some embodiments, a gate capacitor has a larger capacitance variance close to a threshold voltage than a junction capacitor.

In some embodiments, the integrated circuit further includes: a precharging circuit coupled to the sensing node and configured to precharge the sensing node during a precharging phase; and a bit line control circuit having a first control node coupled to a bit line for a memory cell and a second control node coupled to the sensing node. The bit line control circuit is configured to precharge the bit line during the precharging phase and discharge the sensing node by conductively connecting the sensing node with the bit line to provide a sensing current to the memory cell during a discharging phase sequential to the precharging phase.

In some embodiments, the bit line control circuit is configured to conductively disconnect the bit line and the sensing node during the precharging phase.

In some embodiments, the sensing latch circuit is configured such that: when the memory cell stores bit "0", a sensing voltage at the sensing node is greater than a threshold voltage, and the sensing transistor is turned on to change a bit value latched in the at least one sensing latch unit to "0" and when the memory cell stores bit "1", the sensing voltage at the sensing node is smaller than or equal to the threshold voltage, and the sensing transistor is turned off to maintain the bit value latched in the at least one sensing latch unit to "1".

In some embodiments, the storage latch circuit is configured to: turn on one or more latch control circuits of the at least one storage latch unit to update a sensing result in one or more latches of the at least one storage latch unit.

In some embodiments, the at least one sensing latch unit includes a first type of latch, and the at least one storage latch unit includes a second type of latch that is different from the first type of latch.

In some embodiments, one of the first type of latch and the second type of latch is a triple-state latch or a fighting latch.

Another aspect of the present disclosure features an integrated circuit including: a first latch circuit including a sensing transistor coupled to a sensing node and one or more first latch units coupled to the sensing transistor; and a second latch circuit including one or more second latch units, each of the one or more second latch units being same as each of the one or more first latch units, the sensing transistor being different from each transistor in the second latch circuit in that the sensing transistor has a gate terminal coupled to the sensing node and functions as a gate capacitor.

In some embodiments, the integrated circuit further includes a third circuit configured to: during a first phase, separately precharge the sensing node and a bit line that is coupled to a memory cell in a memory device and configured to be disconnected from the sensing node, and during a second phase after the first phase, discharge a sensing voltage at the sensing node according to an equivalent capacitor by conductively connecting the sensing node to the bit line to generate a sensing current to the memory cell through the bit line, where the equivalent capacitor is based on the gate capacitor associated with the sensing transistor and one or more junction capacitors associated with one or more first transistors in the one or more first latch units and one or more second transistors in the one or more second latch units. The first latch circuit is configured to: after the second phase, update data latched in the first latch circuit based on a discharged sensing voltage at the sensing node, and the second latch circuit is configured to: turn on at least one of the one or more second transistors to update the data latched in the first latch circuit into at least one latch in the second latch circuit.

In some embodiments, a total capacitance of the one or more junction capacitors is substantially larger than a capacitance of the gate capacitor.

In some embodiments, the first latch unit is configured to: turn on the sensing transistor to change a bit value latched in the at least one sensing latch unit to "0" when the memory cell stores bit "0" and a sensing voltage at the sensing node is greater than a threshold voltage, or turn off the sensing transistor to keep the bit value latched in the at least one sensing latch unit to be "1" when the memory cell stores bit "1" and the sensing voltage at the sensing node is smaller than or equal to the threshold voltage.

Another aspect of the present disclosure features a method of managing page buffers in a memory device. The method includes: precharging a bit line coupled to a memory cell in the memory device; precharging a sensing node in a page buffer, the page buffer including a sensing latch circuit and a storage latch circuit, the sensing latch circuit including a sensing transistor coupled to the sensing node and at least one sensing latch unit having a first node coupled to the sensing node and a second node coupled to a first terminal of the sensing transistor, the storage latch circuit including at least one storage latch unit having third and fourth nodes coupled to the sensing node and a gate terminal of the sensing transistor, a second terminal of the sensing node being coupled to a ground; discharging a sensing voltage at the sensing node by conductively connecting the bit line to the sensing node to provide a sensing current to the memory cell through the bit line; and updating data latched in the sensing latch circuit based on a discharged sensing voltage at the sensing node.

In some embodiments, updating data latched in the sensing latch circuit based on the discharged sensing voltage at the sensing node includes one of: turning on the sensing transistor to change a bit value latched in the at least one sensing latch unit to "0" when the memory cell stores bit "0" and a sensing voltage at the sensing node is greater than a threshold voltage, or turning off the sensing transistor to keep the bit value latched in the at least one sensing latch unit to be "1" when the memory cell stores bit "1" and the sensing voltage at the sensing node is smaller than or equal to the threshold voltage.

In some embodiments, the method further includes: turning on one or more latch control circuits of the at least one storage latch unit to write a sensing result in one or more latches of the at least one storage latch unit.

Another aspect of the present disclosure features a flash memory including a page buffer circuit and a bit line. The page buffer circuit includes a sub-circuit having a clamping circuit coupled between a bit line node and a sense terminal (or a sensing node) and a precharge circuit coupled between a supply voltage node and the sense terminal. The clamping circuit is configured to stable a current through the clamping circuit, and the precharge circuit is configured to provide a precharged voltage to the sense terminal. The supply voltage node is coupled to a supply voltage, and the bit line node is coupled to the bit line. The page buffer circuit further includes a sensing latch circuit having a sensing transistor and a first latch unit and a storage latch circuit having a second latch unit.

In some embodiments, the first latch unit includes a latch circuit coupled between a data line node and a data line inverse node, a first transistor coupled between a switch node and the data line inverse node, a gate of the first transistor configured to receive a first control signal; a second transistor coupled between the switch node and the data line node, a gate of the second transistor being configured to receive a second control signal; a third transistor coupled between a sense connect node and a connecting node, a gate of the third transistor configured to receive a third control signal; and a fourth transistor coupled between the connecting node and a ground, a gate of the fourth transistor coupled to the data line node. The sensing transistor is coupled between the switch node and the ground, a gate of the sensing transistor is coupled to the sense connect node, and the sense connect node is coupled to the sense terminal. The sensing latch circuit is configured to discharge a voltage of the sense terminal according to the third control signal and a signal on the data line node, and sense the voltage of the sense terminal with the sensing transistor.

In some embodiments, the second latch unit includes: a latch circuit coupled between a data line node and a data line inverse node; a first transistor coupled between a switch node and the data line inverse node, a gate of the first transistor configured to receive a first control signal; a second transistor coupled between the switch node and the data line node, a gate of the second transistor configured to receive a second control signal; a third transistor coupled between a sense connect node and a connecting node, the sense connect node coupled to the switch node, a gate of the third transistor configured to receive a third control signal; and a fourth transistor coupled between the connecting node and the ground, a gate of the fourth transistor coupled to the data line node. The switch node of the second latch unit is coupled to the gate of the sensing transistor, and the storage latch circuit is configured to latch the voltage of the sense terminal at a predetermined level.

Implementations of the above techniques include methods, systems, circuits, computer program products and computer-readable media. In one example, a method can be performed in a non-volatile memory and the method can include the above-described actions, e.g., the actions for managing page buffer circuits. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The techniques can be implemented for any type of circuits or devices that include a number of latches for implementing multiple functions. The latches can be separated into two or more groups, each of which is configured to perform a respective function. The groups can use different types of latches, e.g., a tri-state latch or a fighting latch. The techniques enable to reduce a device area (e.g., a size of a page buffer circuit and/or a memory device), minimize capacitor variation (e.g., caused by gate capacitors), reduce power consumption (e.g., due to large-area capacitors), and improve device performance (e.g., a sensing accuracy).

For example, a page buffer in a memory includes a number of latches configured to complete functions including read, program, and erase operations. In comparison to conventional technologies treating all the latches to be the same, the techniques implemented in the present disclosure provide that the latches in the page buffer can be divided into at least two circuits: a sensing latch circuit and a storage latch circuit. The sensing latch circuit includes a sensing transistor having a gate terminal connected to a sensing node for sensing data through a bit line. The storage latch circuit does not join sensing, but only stores data from a cache data latch (CDL) circuit or the sensing latch circuit. Thus, the storage latch circuit can include no sensing transistor. As a gate capacitor associated with a sensing transistor has a large capacitance variance near a threshold voltage, minimizing the number of sensing transistors can greatly reduce capacitance variance to thereby increase a stability of the capacitance at a sensing node, e.g., due to different PVT (Process-Voltage-Temperature) effects, and to improve a sensing accuracy and/or a sensing yield.

The techniques can be implemented with any types of memory transistors (or memory cells), any types of metal-oxide-silicon (MOS) transistors, e.g., n-channel and/or p-channel transistors, any types of bipolar junction transistors (BJTs), and any types of operational amplifiers. The techniques can be applied to different types of memory systems, e.g., two-dimensional (2D) memory systems or three-dimensional (3D) memory systems. The techniques can be applied to various memory types, such as SLC (single-level cell) devices, or MLC (multi-level cell) devices like 2-level cell devices or TLC (triple-level cell) devices. The techniques can be applied to various types of non-volatile memory devices, such as Static Random Access Memory (SRAM), Dynamic Random Access Memory (DRAM), flash memory such as NOR flash memory and/or NAND flash memory, resistive random-access memory (RRAM), magnetoresistive random-access memory (MRAM), phase-change random-access memory (PCRAM), among others. Additionally or alternatively, the techniques can be applied to various types of devices and systems, such as secure digital (SD) cards, embedded multimedia cards (eMMC), or solid-state drives (SSDs), embedded systems, among others.

The details of one or more disclosed implementations are set forth in the accompanying drawings and the description below. Other features, aspects, and advantages will become apparent from the description, the drawings and the claims.

DETAILED DESCRIPTION

Figure 1A:
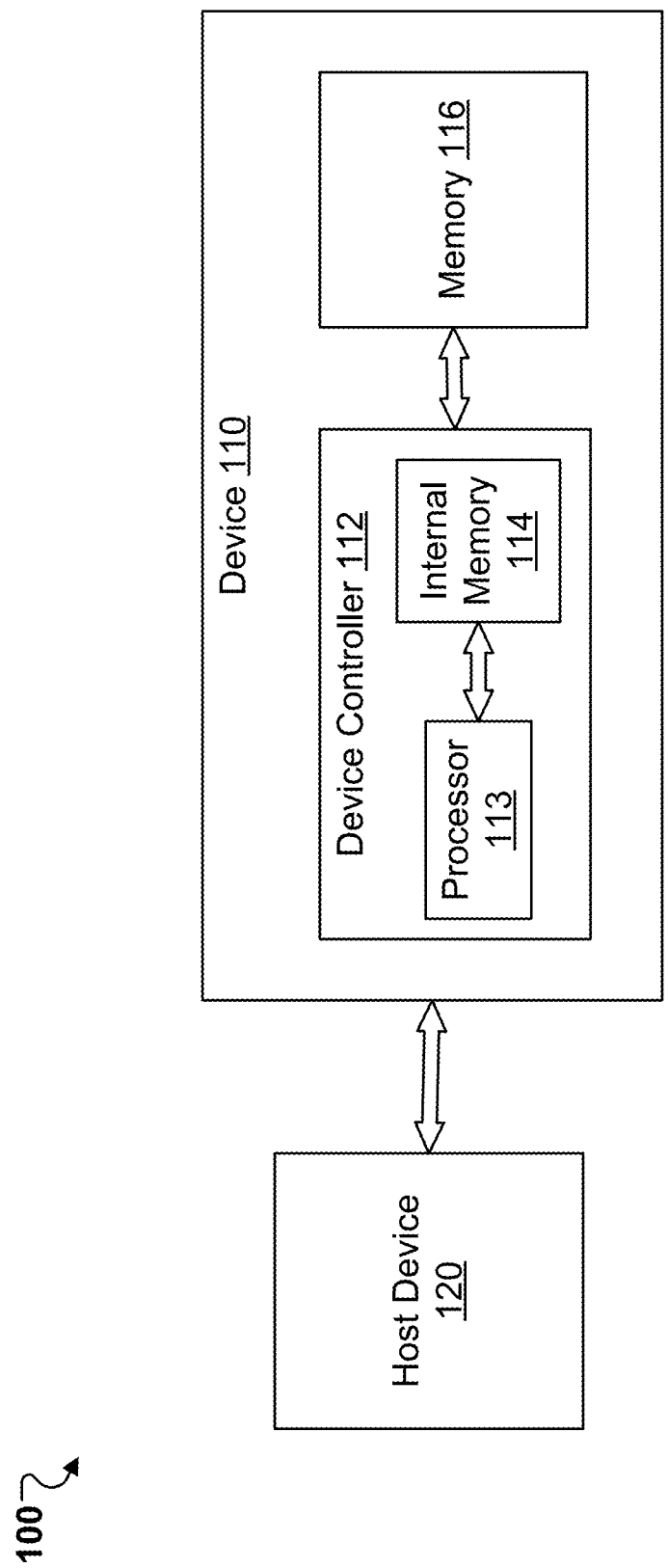
FIG. 1A illustrates an example of a system including a memory system, according to one or more implementations of the present disclosure.

FIG. 1A illustrates an example of a system 100. The system 100 includes a device 110 and a host device 120. The device 110 includes a device controller 112 and a memory 116. The device controller 112 includes a processor 113 and an internal memory 114. In some implementations, the device 110 includes a plurality of memories 116 that are coupled to the device controller 112.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. The memory 116 can be a semiconductor device. In some implementations, the memory 116 is a non-volatile memory that is configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk.

The memory 116 includes a plurality of blocks. The memory 116 can be a two-dimensional (2D) memory including 2D memory blocks. The memory 116 can also be a three-dimensional (3D) memory including 3D memory blocks.

Figure 1B:
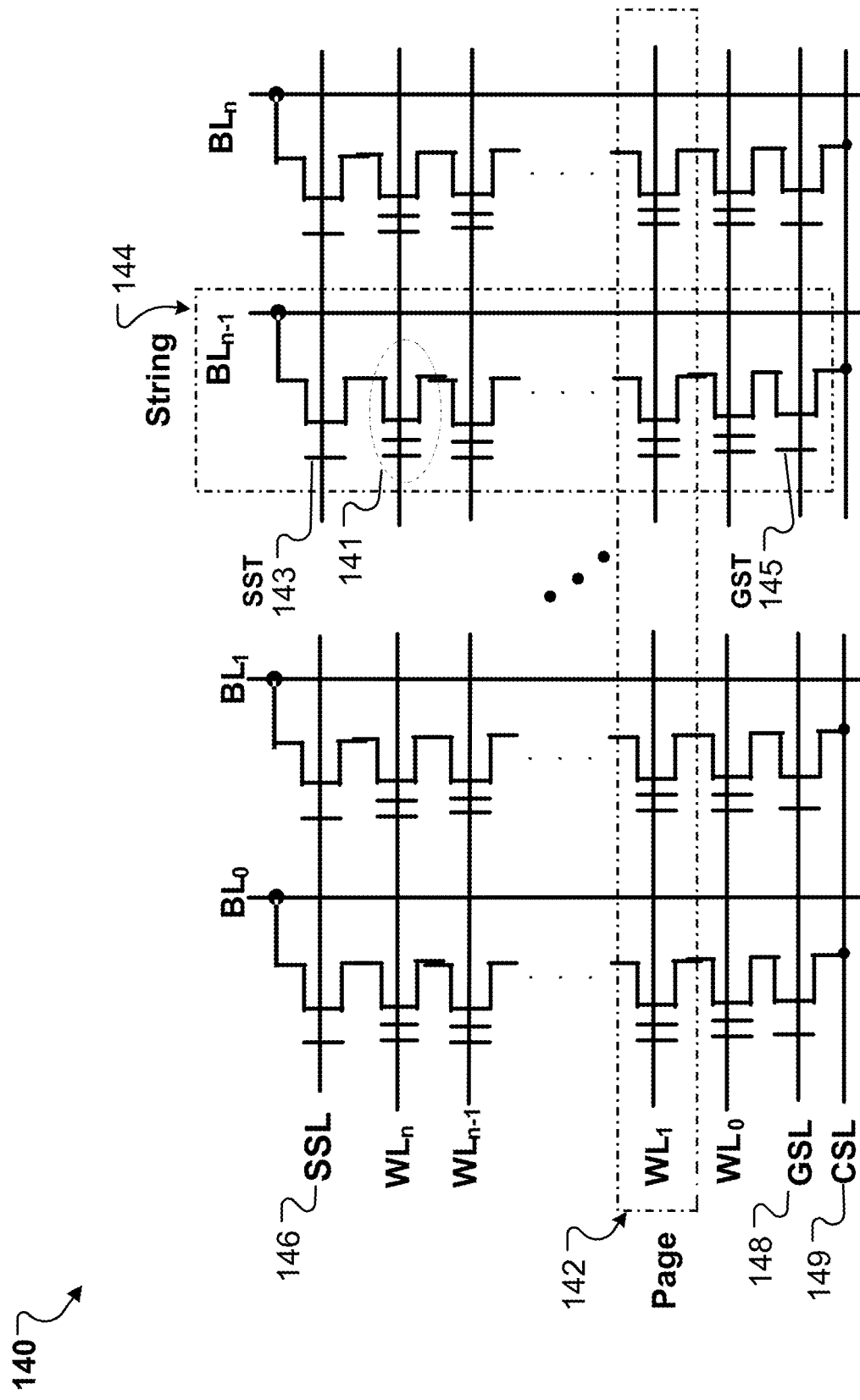
FIG. 1B illustrates an example block of a two-dimensional (2D) memory, according to one or more implementations of the present disclosure.

FIG. 1B illustrates an example configuration of a 2D memory block 140 when the memory 116 is a 2D memory. The block 140 includes memory cells 141 coupled in series to column bit lines $BL_0$, $BL_1$, ..., $BL_{n-1}$, and $BL_n$ to form a number of cell strings 144, and to row word lines $WL_0$, $WL_1$, ..., $WL_{n-1}$, and $WL_n$ to form a number of cell pages 142.

Each memory cell in a block includes a transistor structure having a gate, a drain, a source, and a channel defined between the drain and the source. Each memory cell is located at an intersection between a word line and a bit line, where the gate is connected to the word line, the drain is connected to the bit line, and the source is connected to a source line, which in turn is connected to common ground. In some examples, the gate of a flash memory cell has a dual-gate structure, including a control gate and a floating gate, where the floating gate is suspended between two oxide layers to trap electrons that program the cell.

A cell string 144 can include a number of memory cells 141, a string select transistor (SST) 143, and a ground select transistor (GST) 145, which are all connected in series. A gate of the SST 143 is connected to a string select line (SSL) 146. Gates of the SSTs 143 in different strings are also connected to the same SSL. Gates of the memory cells 141 are respectively connected to word lines $WL_0$, $WL_1$, ..., $WL_{n-1}$, $WL_n$. The cell strings 144 or the memory cells 141 are connected to a common source line (CSL) 149 via the GST 145. The CSL 149 can be coupled to a ground. A gate of the GST 145 is connected to a ground select line (GSL) 148. Gates of the GSTs 145 in different strings 144 are also connected to the same GSL 148.

A cell page 142 can include a number of memory cells 141. Gates of the memory cells 141 in the cell page 142 are coupled in series to a respective word line (WL). When an input voltage is applied to the word line, the input voltage is also applied to the gates of the memory cells 141 in the cell page 142. To read a particular cell page 142 in the block 140 in a read operation, a lower voltage is applied onto a word line corresponding to the particular cell page 142. Meanwhile, a higher voltage is applied onto the other cell pages in the block 140.

Figure 1C:
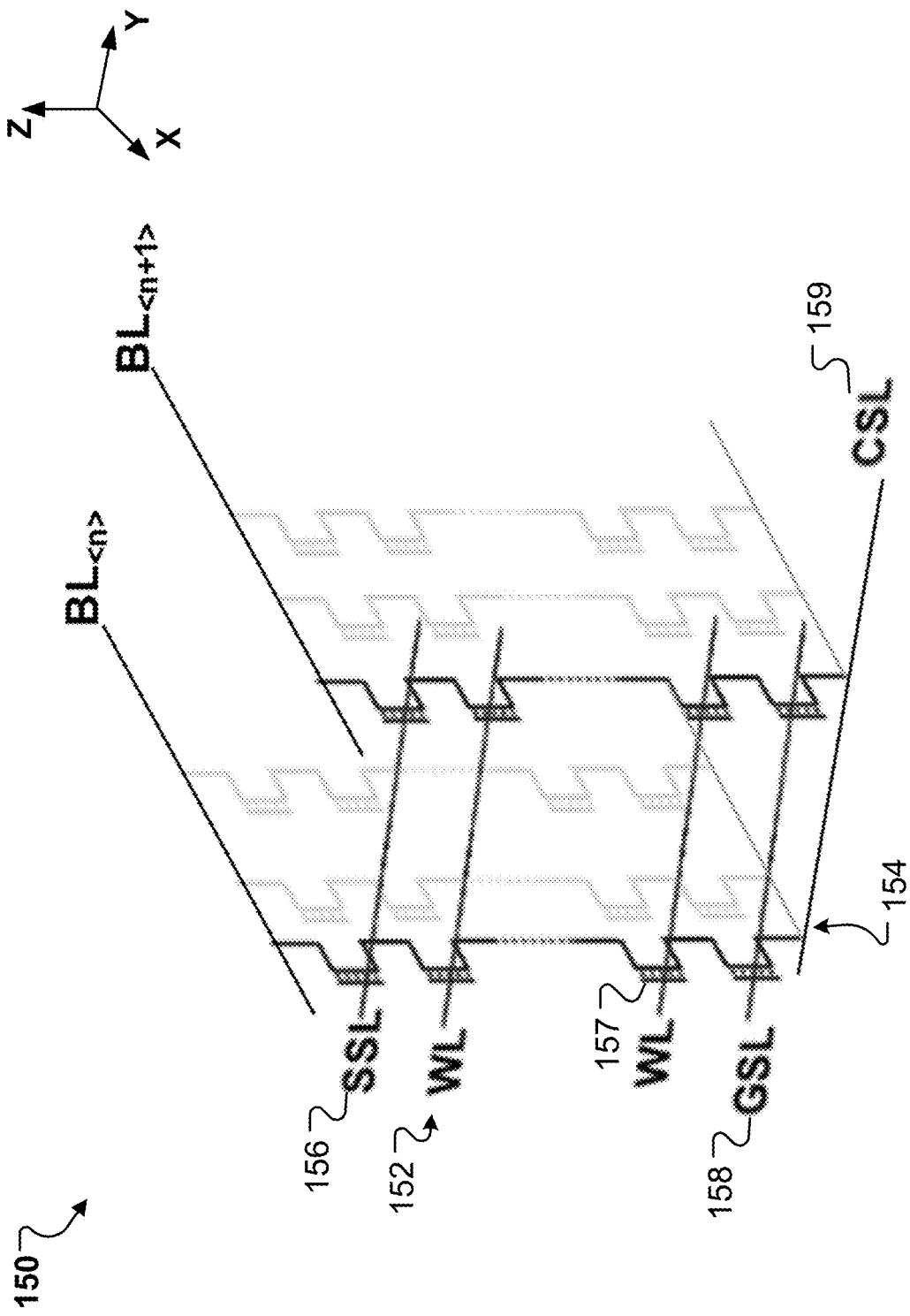
FIG. 1C illustrates an example block of a three-dimensional (3D) memory, according to one or more implementations of the present disclosure.

FIG. 1C illustrates an example 3D memory block 150 when the memory 116 (shown in FIG. 1A) is a 3D memory. The 3D memory block 150 can be a stack of the 2D memory block 140 of FIG. 1B. Memory cells 157 are arranged in three dimensions, e.g., in an XYZ coordinate system, and coupled to a number of word lines to form a number of cell pages (conductive layers or word line layers) 152 and a number of bit lines to form a number of cell strings 154. A cell page 152 can be a layer, e.g., in the XY plane, and memory cells 157 on the same layer can be coupled to one word line and have a same voltage. Each cell page 152 can be connected to a respective contact pad in a driving circuit, e.g., X-decoder (or a scanning driver).

A cell string 154 includes a number of memory cells 157 connected in series vertically along the Z direction, where a memory cell can be configured as an SST coupled to a string select line (SSL) 156 and a memory cell can be configured as a GST coupled to a ground select line (GSL) 158. The cell strings 154 are connected to one or more drivers, e.g., data drivers. The cell strings 154 of the memory cells 157 are connected to a common source line (CSL) 159 via the ground select transistors (GSTs). The CSL 159 can be a conductive layer (or multiple conductive lines) formed on a substrate of the 3D memory. The CSL 159 can be coupled to the ground.

Figure 2:
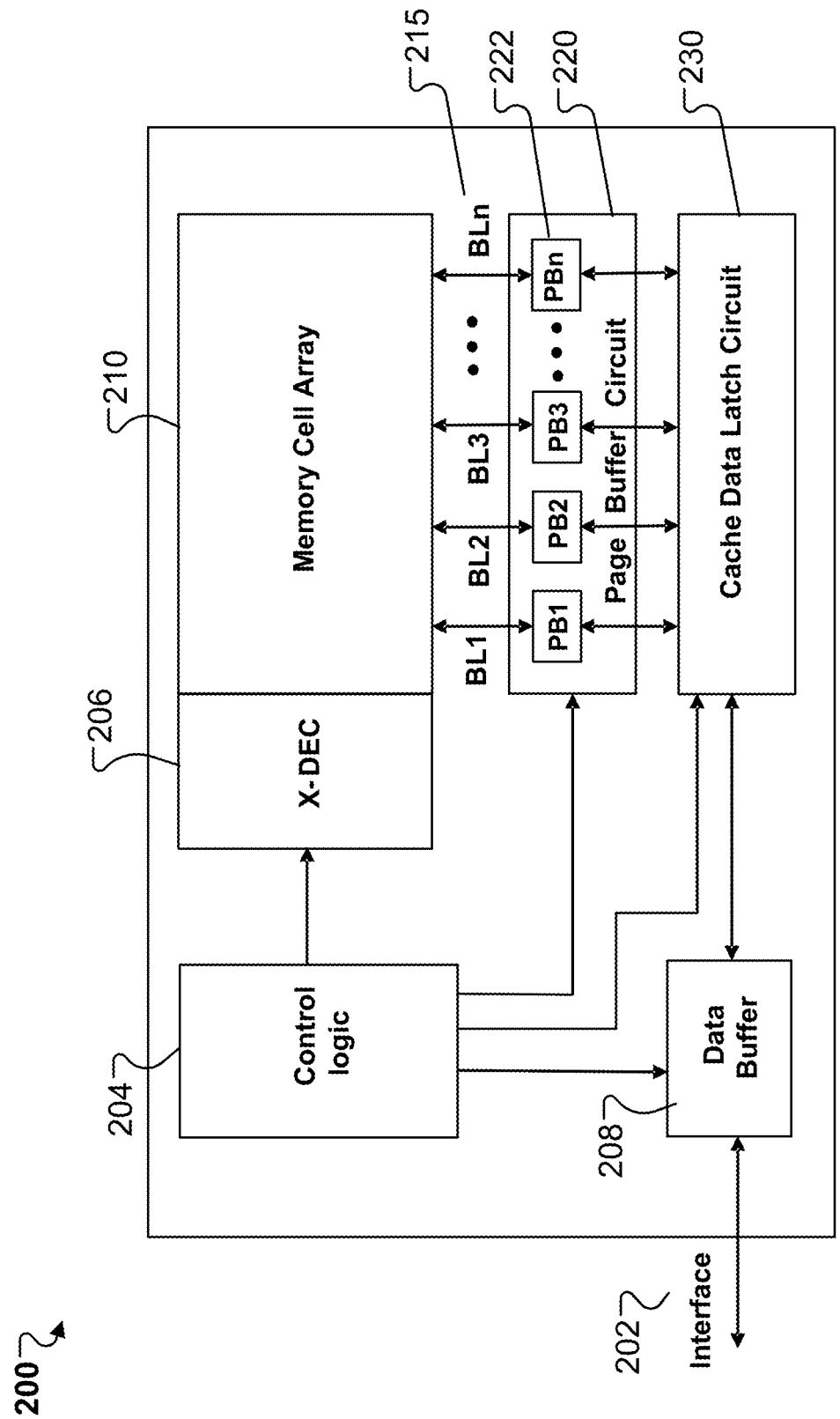
FIG. 2 illustrates an example memory device including a page buffer circuit having a number of page buffers, according to one or more implementations of the present disclosure.

FIG. 2 illustrates an example configuration of a memory device 200. The memory device 200 can be implemented as the memory 116 of FIG. 1A. The memory device 200 includes a memory cell array 210. The memory cell array 210 can include a number of memory cells, e.g., the memory cells 141 of FIG. 1B or 157 of FIG. 1C, coupled in series to a number of row word lines and a number of column bit lines.

A memory cell can include a memory transistor configured as a storage element. The memory transistor can include a silicon-oxide-nitride-oxide-silicon (SONOS) transistor, a floating gate transistor, a nitride read only memory (NROM) transistor, or any suitable non-volatile memory MOS device that can store charges.

The memory device 200 includes a memory interface 202 having multiple input/output (I/O) ports for receiving data, e.g., from a memory controller such as the device controller 112 of FIG. 1A, or outputting data from the memory cell array 210. The memory device 200 includes a data buffer 208 configured to buffer data received and outputted through the memory interface 202.

The memory 200 further includes an X-decoder (or row decoder) 206 and a Y-decoder (not shown). Each memory cell is coupled to the X-decoder 206 via a respective word line and coupled to the Y-decoder via a respective bit line 215 (BL1, BL2, ... BLn). Accordingly, each memory cell can be selected by the X-decoder 206 and the Y-decoder for read or write operations through the respective word line and the respective bit line 215.

The memory device 200 includes a page buffer circuit 220 that includes a number of page buffers 222. Each page buffer 222 (PB1, PB2, PB3, ..., PBn) is connected to the memory cell array 210 through a respective bit line 215 (BL1, BL2, BL3, ..., BLn). In some embodiments, a page buffer 222 is connected to the Y-decoder through a data line associated with a corresponding bit line 215 that connects a corresponding line of memory cells in the memory cell array 210. A page buffer is configured to control a voltage on a corresponding bit line to perform an operation, e.g., read, program, or erase, on a memory cell coupled to the corresponding bit line.

In some embodiments, the memory device 200 further includes a cache data latch (CDL) circuit 230 coupled between the page buffer circuit 220 and the data buffer 208. During a program or erase operation, the CDL circuit 230 is configured to store data from the data buffer 208 and/or output to one or more page buffers 222 in the page buffer circuit 220. During a read operation, the CDL circuit 230 is configured to store data from one or more page buffers 222 in the page buffer circuit 220 and/or output data to the data buffer 208.

The memory device 200 further includes a control logic 204 coupled to components in the memory device 200 including the X-decoder 206 and the Y-decoder, the data buffer 208, the page buffer circuit 220, and the CDL circuit 230. The control logic 204 is configured to receive a command, address information, and/or data, e.g., from a memory controller such as the device controller 112 of FIG. 1A, via the memory interface 202. The control logic 204 can also process the command, the address information, and/or the data, for example, to generate physical address information, e.g., of blocks/pages, in the memory cell array 210.

In some implementations, the control logic 204 includes a data register, an SRAM buffer, an address generator, a mode logic, and a state machine. The mode logic can be configured to determine whether there is a read or write operation and provide a result of the determination to the state machine.

During a write operation, the data register in the control logic 204 can register input data from the interface 202, and the address generator in the control logic 204 can generate corresponding physical addresses to store the input data in specified memory cells of the memory cell array 210. The address generator can be connected the X-decoder 206 and the Y-decoder that are controlled to select the specified memory cells through corresponding word lines and bit lines. The SRAM buffer can retain the input data from the data register in its memory as long as power is being supplied. The state machine can process a write signal from the SRAM buffer and provide a control signal to a voltage generator that can provide a write voltage to the X-decoder 206 and/or the Y-decoder. The Y-decoder is configured to output the write voltage to the bit lines (BLs) for storing the input data in the specified memory cells.

During a read operation, the state machine can provide control signals to the voltage generator and the page buffer circuit 220. The voltage generator can provide a read voltage to the X-decoder 206 and the Y-decoder for selecting a memory cell. A page buffer 222 can sense a small power signal (e.g., a current signal) that represents a data bit ("1" or "0") stored in the selected memory cell through a bit line 215 coupled to the page buffer 222 and the selected memory cell. A sense amplifier can amplify the small power signal swing to recognizable logic levels so the data bit can be interpreted properly by logic inside or outside the memory device 200. In some implementations, the page buffer circuit 220 and/or the CDL circuit 230 are included in the sense amplifier. The data buffer 208 can receive the amplified voltage from the sensor amplifier and output the amplified power signal to the logic outside the memory device 200 through the memory interface 202.

To sense data stored in a memory cell by sensing a current through a corresponding bit line, a page buffer needs to have a capacitor on a sensing node for precharging and discharging at the sensing node. During a precharging phase of the page buffer, the capacitor on the sensing node is precharged to have a predetermined sensing voltage. Then during a discharging phase following the precharging phase, charges stored in the capacitor is discharged by a sensing current flowing to the memory cell via a corresponding bit line. Bit values latches in one or more latches in the page buffer can be updated based on a discharged sensing voltage $V_{SEN}$ at the sensing node.

During a sensing phase (or a strobing phase) following the discharging phase, if the memory cell stores a bit "0", the discharged sensing voltage $V_{SEN}$ at the sensing node can be greater than a predetermined threshold voltage $V_{Th}$, e.g., a strobe voltage $V_{strobe}$ associated with latches in the page buffer. Accordingly, the page buffer can be configured to update a bit value "1" latched in the one or more latches to sensing value "0" or to strobe the sensing value "0" to the one or more latches. In contrast, if the memory cell stores a bit "1", the discharged sensing voltage $V_{SEN}$ at the sensing node can be smaller than or equal to the predetermined threshold voltage $V_{Th}$. Accordingly, the page buffer can be configured to maintain (or keep) the bit value "1" latches in the one or more latches.

If the capacitance at the sensing node is not stable and changes dramatically, e.g., near the threshold voltage $V_{Th}$, the sensing result may be wrong. If the capacitance at the sensing node is small, the precharging and discharging phases cannot be fully performed for sensing. Thus, it is desirable for the page buffer to have a large and stable capacitance for the capacitor on the sensing node to be fully and stably precharged and discharged to thereby achieve accurate sensing.

In some implementations, a transistor, e.g., a metal-oxide-semiconductor field-effect transistor (MOSFET), is used as a capacitor (e.g., a MOS capacitor) coupled to the sensing node in a page buffer. However, the transistor having a large capacitance tends to have a large size occupying a large area, which makes a total area of the page buffer increase.

In some implementations, a page buffer includes a number of identical latch units. Each latch unit includes a latch coupled between a respective sensing transistor and a respective coupling transistor that both are coupled to the sensing node. Each sensing transistor has a gate terminal coupled to the sensing node and functions as a gate capacitor. Each coupling transistor has a drain (or source) terminal coupled to the sensing node and functions as a junction capacitor. Instead of using a MOS capacitor in the page buffer, the capacitor at the sensing node of the page buffer is determined by gate capacitors associated with the respective sensing transistors in the latch units, junction capacitors associated with the respective coupling transistors in the latch units, and metal line routing in the page buffer.

Figure 3:
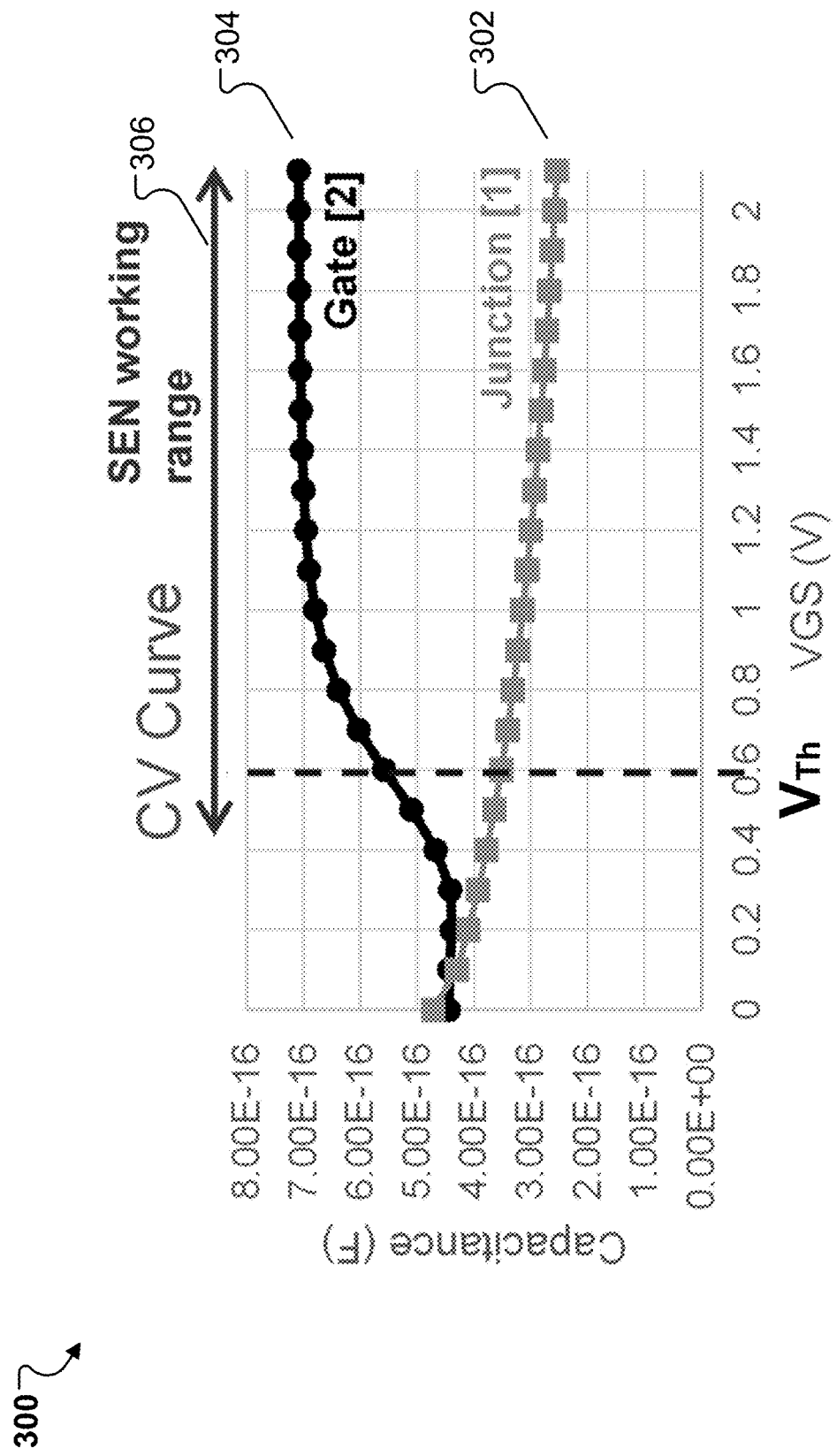
FIG. 3 shows example relationships between voltages and capacitances for a junction capacitor and a gate capacitor, according to one or more implementations of the present disclosure.

FIG. 3 is a diagram 300 illustrating example relationships between voltages and capacitances for a junction capacitor and a gate capacitor, according to one or more implementations of the present disclosure. When voltage $V_{GS}$ between gate and source terminals of the sensing transistor varies, a capacitance of the junction capacitor varies according to capacitance-voltage (CV) curve 302, and a capacitance of the gate capacitor varies according to CV curve 304. Line 306 shows a sensing working range of the voltage $V_{GS}$ in the page buffer. The CV curves 302 and 304 show that near a threshold voltage $V_{Th}$, the capacitance of the gate capacitor has a larger change (e.g., slope) than the capacitance of the junction capacitor. Thus, if a ratio between a number of gate capacitors and a number of junction capacitors is large, e.g., identical to 1, the capacitance at the sensing node may change severely near the predetermined threshold voltage $V_{Th}$, which may cause wrong sensing results.

Implementations of the present disclosure provide page buffers with large and stable capacitance for sensing data in memory cells, e.g., by minimizing the effect of gate capacitor(s) in the page buffers. In some implementations, as discussed with further details in FIG. 4, latch units in the page buffer are grouped into at least two circuits: a sensing latch circuit and a storage latch circuit. The sensing latch circuit includes one or more latch units coupled to a sensing transistor that has a gate terminal connected to a sensing node for sensing data through a bit line. The one or more latch units share the sensing transistor. The storage latch circuit does not join sensing, but only stores data from the sensing latch circuit or a cache data latch (CDL) circuit (e.g., the CDL circuit 230 of FIG. 2). Thus, the storage latch circuit can include no sensing transistor. Accordingly, the effect of the gate capacitor associated with the sensing transistor in the page buffer can be minimized to increase a stability of the capacitance at the sensing node and to thereby improve a sensing accuracy and/or a sensing yield of the page buffer.

In some implementations, a number of latch units in a page buffer is determined based on a memory cell type of memory cells in a memory cell array. For example, if the memory cell type of a memory cell is SLC, the page buffer for the memory cell can include 2 latch units; if the memory cell type of a memory cell is MLC, the page buffer can include 3 latch units; if the memory cell type of a memory cell is TLC, the page buffer can include 5 latch units; if the memory cell type of a memory cell is QLC, the page buffer can include 6 latch units. For illustration purposes only, a page buffer including 5 latch units for a TLC is described herein.

Figure 4:
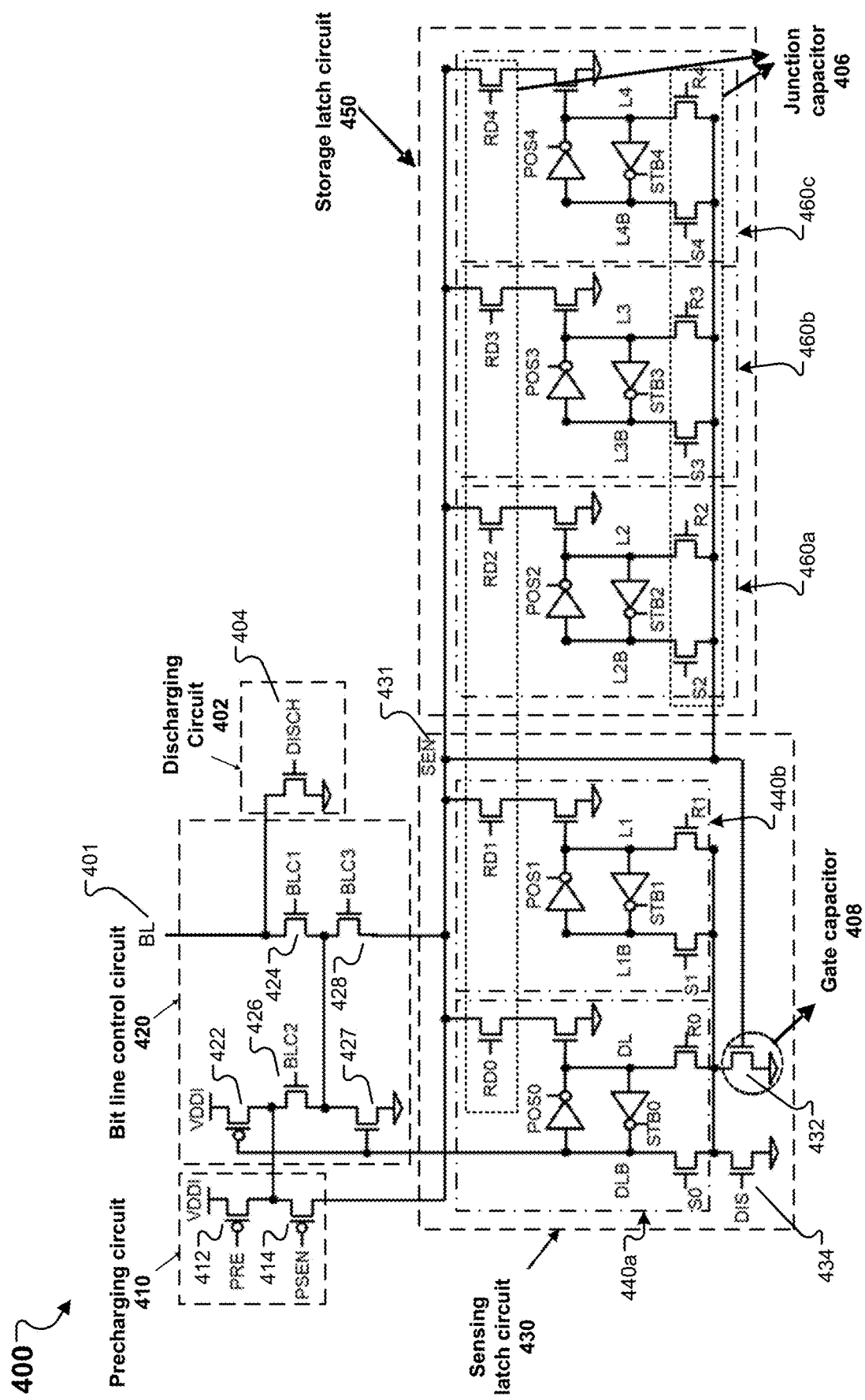
FIG. 4 shows a circuit diagram illustrating an example page buffer including a sensing latch circuit and a storage latch circuit, according to one or more implementations of the present disclosure.

FIG. 4 shows a circuit diagram illustrating an example page buffer 400, according to one or more implementations of the present disclosure. The page buffer 400 can be implemented as the page buffer 222 of FIG. 2. The page buffer 400 includes five latch units 440a, 440b, 460a, 460b, 460c that are grouped into two circuits: a sensing latch circuit 430 and a storage latch circuit 450. The sensing latch circuit 430 is configured to sense data stored in a memory cell via a bit line 401, and the storage latch circuit 450 is configured to store data from the sensing latch circuit 430 or from a CDL circuit, e.g., the CDL circuit 230 of FIG. 2.

Figure 5:
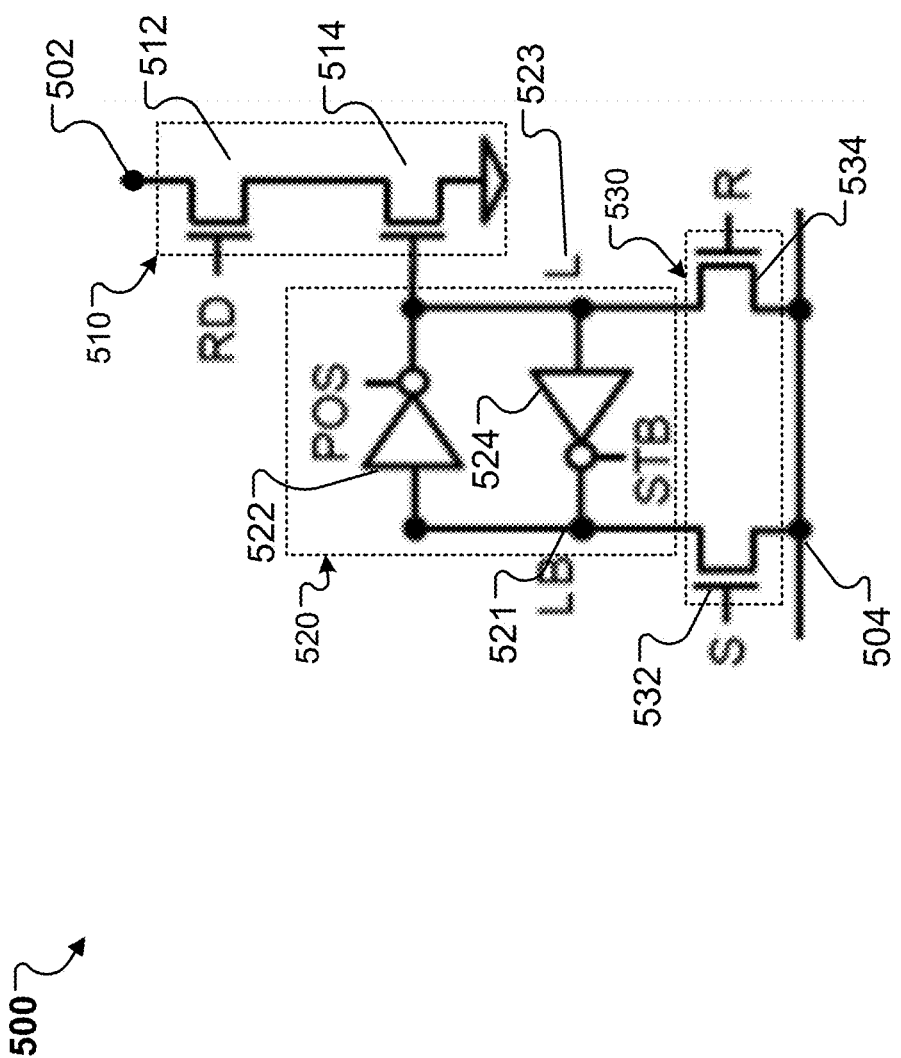
FIG. 5 shows a circuit diagram illustrating an example latch unit, according to one or more implementations of the present disclosure.

Each of the five latch units can have a same structure. As illustrated in FIG. 5, a latch unit 500 includes a first node (e.g., an input node) 502 and a second node (e.g., an output node) 504. The latch unit 500 includes a latch 520 coupled between a coupling circuit 510 coupled to the first node and a latch control circuit 530 coupled to the second node.

The latch 520 includes a pair of first and second inverters 522, 524. The latch 520 can be a tri-state latch or a fighting latch. The first inverter 522 is configured to receive a corresponding signal POS, and the second inverter 524 is configured to receive a corresponding standby signal STB. A value corresponding to a voltage at LB node 521 between the inverters 522, 524 is opposite to a value corresponding to a voltage at L node 523 between the inverters 522, 524. The latch 520 stores data by updating the value at the LB node 521 and/or the value at the L node 523.

The coupling circuit 510 includes a first coupling transistor 512 and a second coupling transistor 514 that both can be an n-channel transistor (e.g., a NMOS transistor). The first coupling transistor 512 includes a gate terminal for receiving a control signal RD, a drain terminal coupled to the first node 502, and a source terminal coupled to a drain terminal of the second coupling transistor 514 that has a source terminal coupled to a ground and a gate terminal coupled to the first inverter 522, e.g., to the L node 523.

The latch control circuit 530 includes a latch setup transistor 532 coupled between the LB node 521 and the second node 504 and a latch reset transistor 534 coupled between the L node 523 and the second node 504. The latch setup transistor 532 has a gate terminal for receiving a setup signal S, a drain terminal coupled to the LB node 521, and a source terminal coupled to the second node 504. The latch reset transistor 534 has a gate terminal for receiving a reset signal R, a drain terminal coupled to the L node 523, and a source terminal coupled to the second node 504. That is, the source terminals of the latch setup transistor 532 and latch reset transistor 534 are coupled to the sensing node 504.

For a page buffer implemented in the present disclosure, each of the sensing latch circuit and the storage latch circuit includes at least one latch unit. For a lower-level memory cell, e.g., SLC or MLC, the sensing latch circuit can include only one latch unit; for a higher-level memory cell, e.g., TLC or QLC, the sensing latch circuit can include one or more other latch units for quick pass write (QPW) operation. For example, the sensing latch circuit can include two latch units for TLC and QLC. A number of latch units in the storage latch circuit is determined based on a number of bits stored in a memory cell. For example, the storage latch circuit can include one latch unit for SLC, two latch units for MLC, three latch units for TLC, and four latch units for QLC.

Referring back to FIG. 4, for a TLC memory cell, the sensing latch circuit 430 includes two sensing latch units (or sensing latches) 440a, 440b (referred to generally as sensing latch units 440 and individually as sensing latch unit 440). The storage latch circuit 450 includes three latch units (or storage latches) 460a, 460b, 460c (referred to generally as storage latch units 460 and individually as storage latch unit 460).

The sensing latch circuit 430 further includes a sensing transistor 432 coupled to the sensing latch units 440, while the storage latch circuit 450 includes no sensing transistor. Latches in the sensing latch circuit 430 and the storage latch circuit 450 can be tri-state latches, fighting latches, or any suitable latches. In some embodiments, the latches have a same latch type. In some embodiments, as the sensing latch circuit 430 and the storage latch circuit 450 perform different functions, e.g., sensing data versus storing data, latches in the sensing latch circuit 430 and the storage latch circuit 450 can have different latch types.

The sensing transistor 432 has a gate terminal coupled to a sensing node (SEN) 431, a source terminal coupled to a ground, and a drain terminal coupled to the sensing latch units 440. The sensing transistor 432 functions as a gate capacitor 408. Each sensing latch unit 440 has a first node (e.g., the first node 502 of FIG. 5) is coupled to the sensing node 431. For example, a first coupling transistor (e.g., the coupling transistor 512 of FIG. 5) in a coupling circuit (e.g., the coupling circuit 510 of FIG. 5) of the sensing latch unit 440 is coupled to the sensing node 431. The first coupling transistor functions as a junction capacitor 406. Each sensing latch unit 440 includes a second node (e.g., the second node 504 of FIG. 5) is coupled to the drain terminal of the sensing transistor 432. For example, a latch control circuit (e.g., the latch control circuit 530 of FIG. 5) of the sensing latch unit 440 is coupled to the drain terminal of the sensing transistor 432. The sensing latch circuit 430 senses data by updating a value at DLB node or L1B node (e.g., the LB node 521 of FIG. 5) and/or a value at DL node or L1 node (e.g., the L node 523 of FIG. 5).

In some implementations, the sensing latch circuit 430 includes a discharging transistor 434 that has a gate terminal for receiving a discharging signal, a source terminal coupled to the ground, and the drain terminal coupled to the sensing latch unit 440, e.g., to the second node of the sensing latch unit 440.

The storage latch circuit 450 includes the three storage latch units 460 that can be coupled in parallel. Each storage latch unit 460 includes a third node (e.g., the first node 502 of FIG. 5) coupled to the sensing node 431 and a fourth node (e.g., the second node 504 of FIG. 5) coupled to the sensing node 431. For example, a first coupling transistor (e.g., the coupling transistor 512 of FIG. 5) in a coupling circuit of the storage latch unit 460 is coupled to the sensing node 431. Thus, the first coupling transistor functions as a junction capacitor 406. Similarly, transistors (e.g., the latch setup transistor 532 and the latch reset transistor 534 of FIG. 5) in a latch control circuit of the storage latch unit 460 can be also coupled to the sensing node 431 and the gate terminal of the sensing transistor 432. Thus, the transistors in the latch control circuit of the storage latch circuit 460 can also function as junction capacitors 406.

An equivalent capacitor at the sensing node 431 of the page buffer 400 is determined based on the gate capacitor 408, the junction capacitors 406, and metal line routings in the page buffer 400. As shown in FIG. 4, each of the first coupling transistors in the sensing latch units 440, the first coupling transistors of the storage latch units 460, and the latch setup transistors and latch reset transistors in the latch control circuit of the storage latch units 460, can function as a junction capacitor 406. In contrast, there is only one sensing transistor 432 functioning as a gate capacitor 408. Thus, a ratio of the number of gate capacitor and the number of junction capacitors in the page buffer 400 can be greatly decreased, e.g., to 1/11. Accordingly, a capacitance of the sensing transistor 432 is substantially smaller than a total capacitance of the junction capacitors 406, and the effect of the gate capacitor to the equivalent capacitor (and equivalent capacitance) can be greatly suppressed, which can increase the stability of the equivalent capacitance near a threshold voltage $V_{Th}$, e.g., $V_{strobe}$.

In some implementations, as shown in FIG. 4, the page buffer 400 includes a precharging circuit 410 and a bit line control circuit (or a clamping circuit) 420. The precharging circuit 410 is coupled to the sensing node 431. The bit line control circuit 420 has a first control node coupled to the bit line 401 and a second control node coupled to the sensing node 431. As discussed with further details in FIGS. 6A-6C and FIG. 7 below, the precharging circuit 410 is configured to precharge the sensing node 431 during a precharging phase. The bit line control circuit 420 is configured to precharge the bit line 401 during the precharging phase and discharge the sensing node 431 during a discharging phase sequential to the precharging phase.

As shown in FIG. 4, the precharging circuit includes two p-channel transistors 412 and 414 (e.g., PMOS transistors) coupled in series between a supply voltage VDDI and the sensing node 431. The transistor 412 has a source terminal for receiving the supply voltage VDDI, a gate terminal for receiving a precharging control signal PRE. The transistor 414 has a gate terminal for receiving a precharging enable signal PSEN, a source terminal coupled to a drain terminal of the transistor 412, and a drain terminal coupled to the sensing node 431.

As shown in FIG. 4, the bit line control circuit 420 includes a p-channel transistor 422 for receiving a supply voltage VDDI, three n-channel transistors 424, 426, 428 for receiving respective bit line control signals BLC1, BLC2, BLC3, and an n-channel transistor 427 for coupling to the ground. The transistor 422 has a source terminal for receiving the supply voltage VDDI and a gate terminal coupled to the sensing latch circuit 430, e.g., to the DLB node of the latch in the sensing latch unit 440a. The transistor 426 has a drain terminal coupled to a drain terminal of the transistor 422, a gate terminal for receiving the bit line control signal BLC2, and a source terminal coupled to a drain terminal of the transistor 427. The transistor 427 includes a source terminal coupled to the ground and a gate terminal coupled to the gate terminal of the transistor 422. The precharging circuit 410 is coupled to the bit line control circuit 420 by connecting a node between the drain terminal of the transistor 412 and the source terminal of the transistor 414 to a node between the drain terminal of the transistor 422 and the drain terminal of the transistor 426. The transistor 424 has a drain terminal coupled to the bit line 401 and a gate terminal coupled to a node between the source terminal of the transistor 426 and the drain terminal of the transistor 427. The transistor 428 has a drain terminal coupled to a source terminal of the transistor 424, a source terminal coupled to the sensing node 431, and a gate terminal for receiving a bit line control signal BLC3.

In some implementations, the page buffer 400 includes a discharging circuit 402 that includes a discharging transistor 404, e.g., an n-channel transistor. The discharging transistor 404 has a drain terminal coupled to the drain terminal of the transistor 424, a gate terminal for receiving a discharging signal DISCH, and a source terminal coupled to the ground.

Figure 6A:
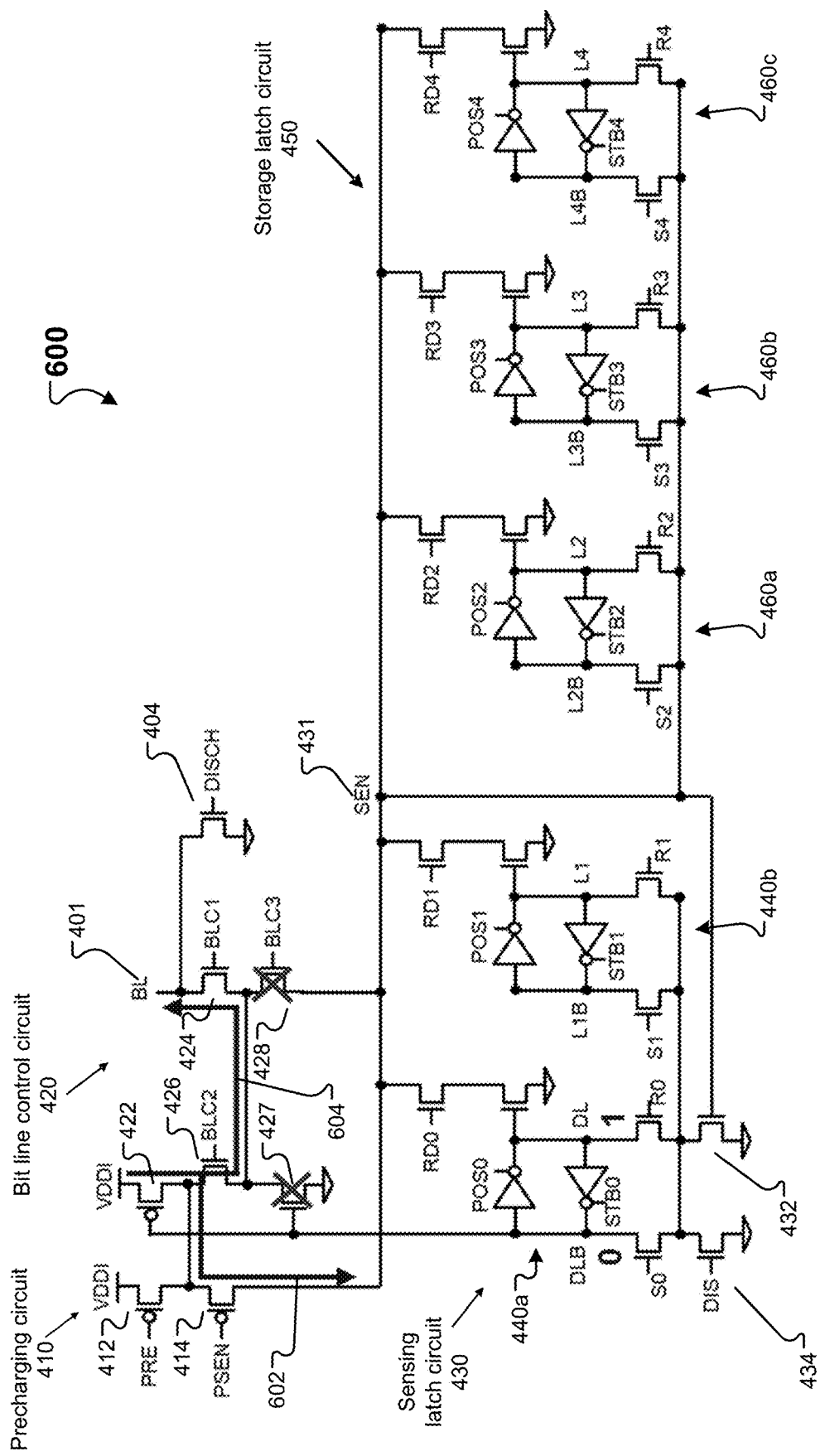
FIGS. 6A-6C show example circuit diagrams of a page buffer of FIG. 4 in different operation phases, according to one or more implementations of the present disclosure.
Figure 6B:
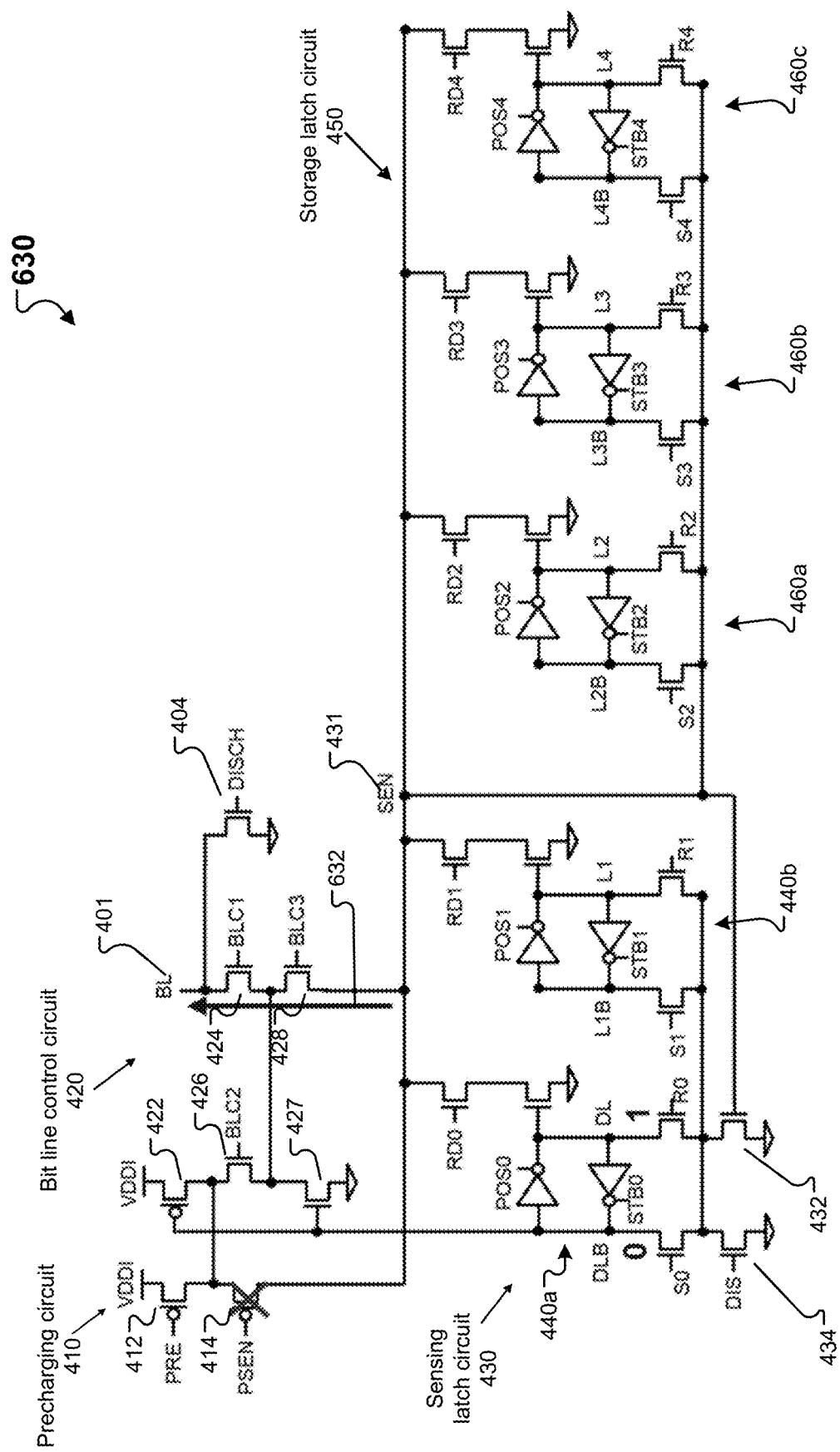
Figure 6C:
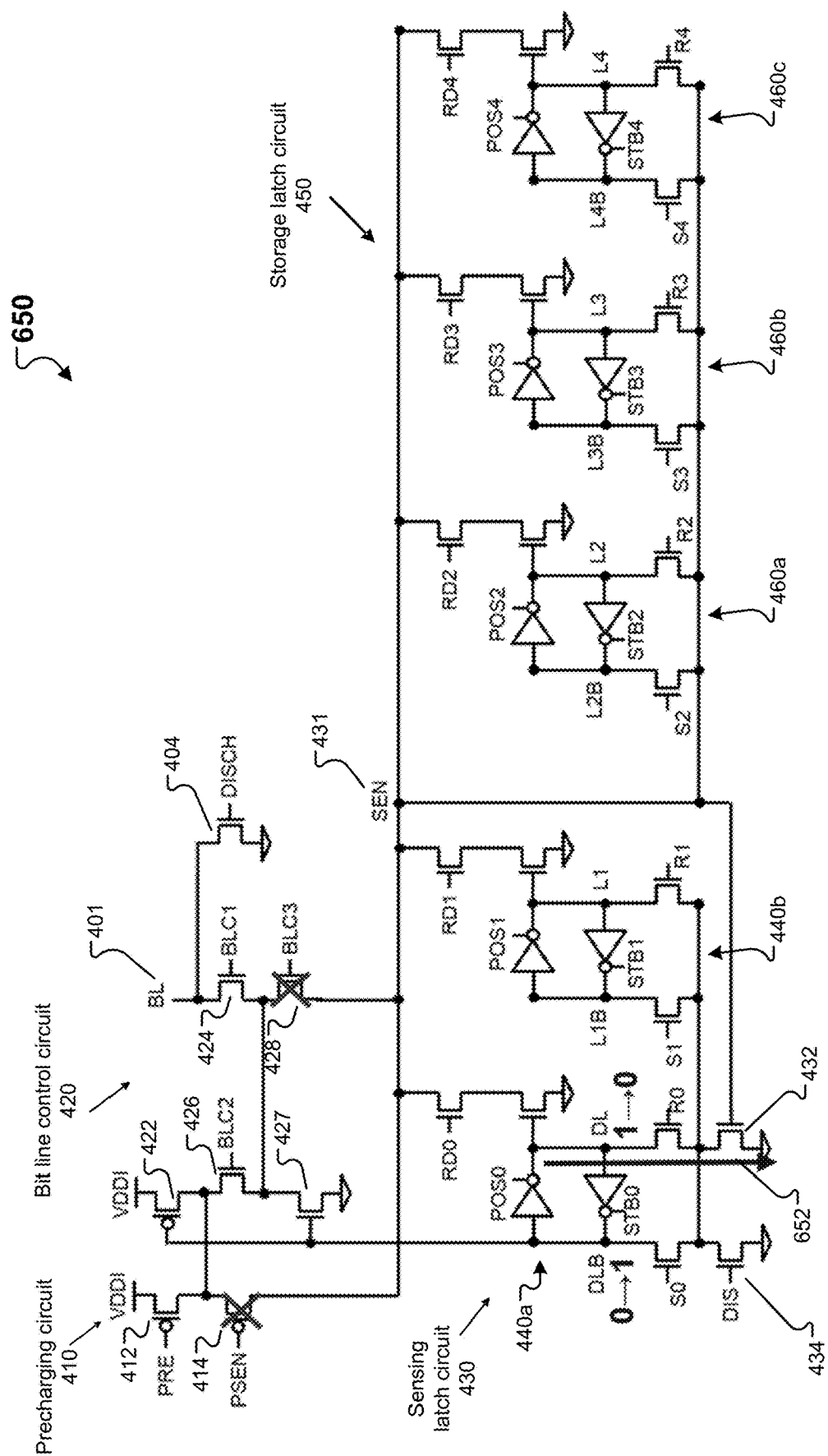
Figure 7:
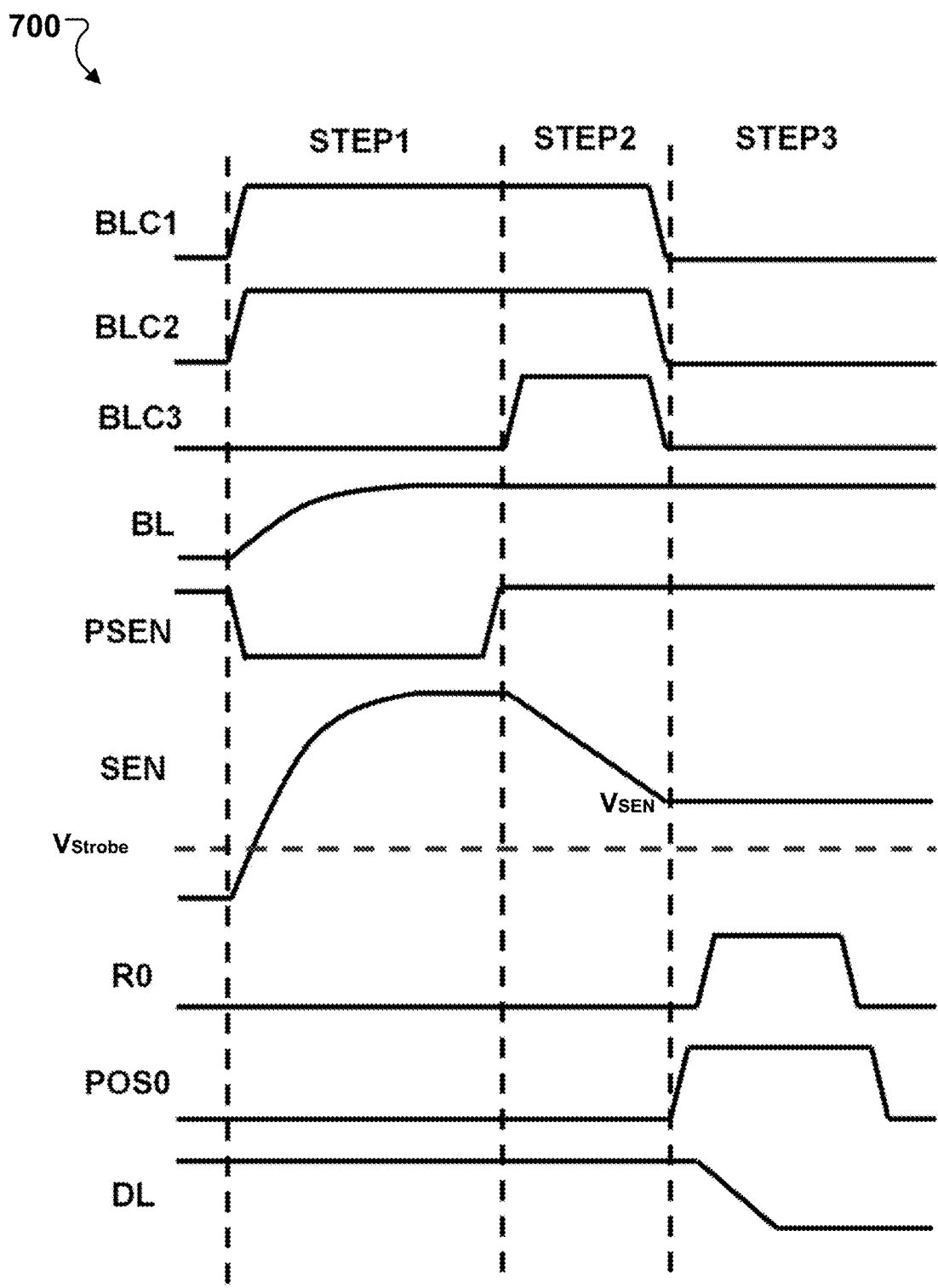
FIG. 7 shows a timing diagram illustrating voltage changes at different nodes of the page buffer during the operation phases of FIGS. 6A-6C, according to one or more implementations of the present disclosure.

FIGS. 6A-6C show example circuit diagrams 600, 630, 650 of a page buffer of FIG. 4 in different operation phases (or steps), including a precharging phase (STEP 1), a discharging phase (STEP 2), and a sensing phase (STEP 3). FIG. 7 shows a timing diagram 700 illustrating voltage changes at different nodes of the page buffer 400 during the operation phases (or steps) of FIGS. 6A-6C.

Initially, as shown in FIG. 6A, in the sensing latch circuit 430, the sensing latch unit 440 maintains a low voltage (e.g., $V_{SS}$) corresponding to bit "0" at the DLB node and a high voltage corresponding to bit "1" at the LB node. The p-channel transistor 422 is on as its gate terminal is coupled to the DLB node, and the n-channel transistor 427 is off as its gate terminal is coupled to the DLB node.

During the precharging phase, as FIG. 6A and STEP 1 in FIG. 7 show, the transistor 414 is turned on by receiving a corresponding PSEN signal (with a low voltage level) at its gate terminal. Accordingly, the pre-charging circuit 410 is turned on to precharge the sensing node 431 from a lower voltage level (e.g., a voltage corresponding to bit "0") to a higher voltage level (e.g., a predetermined sensing voltage). The sensing node 431 can be precharged by a supply voltage via the transistor 422 and the transistor 414 along a current path 602.

During the precharging phase, the n-channel transistors 424 and 426 are turned on by receiving corresponding control signal BLC1, BLC2, while the n-channel transistor 428 is off. Thus, the bit line 401 is precharged to a predetermined bit line voltage by the supply voltage via the transistor 422, the transistor 426 and the transistor 424 along a current path 604. As the transistor 428 is off, the bit line is conductively disconnected to the sensing node 431. The predetermined sensing voltage at the sensing node 431 can be higher than the predetermined bit line voltage at the bit line 401.

During the discharging phase following the precharging phase, as FIG. 6B and STEP 2 in FIG. 7 show, the transistor 414 is turned off by changing the PSEN signal from the low level to a high level at its gate terminal. Thus, the current path 602 is closed. Accordingly, the sensing node 431 is no longer charged by the precharging circuit 410. Instead, the transistor 428 is turned on by receiving an enable signal BLC3 (a high voltage level) at its gate terminal, and the sensing node is conductively connected to the bit line 401. Accordingly, the predetermined sensing voltage at the sensing node 431 is discharged by providing a sensing current to the bit line 401 via the transistors 428 and 424 along a current path 632.

During the precharging phase and the discharging phase, as shown in FIG. 7, the latch control circuit (e.g., the latch control circuit 530 of FIG. 5) in the sensing latch unit 440 is off, e.g., by keeping the latch reset transistor (e.g., the latch reset transistor 534 of FIG. 5) off with the control signal RO at a low level. The first inverter (e.g., the inverter 522 of FIG. 5) in the latch in the sensing latch unit 440 is on by receiving a signal POS0 with a low level. Accordingly, the bit value, e.g., "1" at the DL node, stored in the sensing latch unit 440 is kept at the same value.

At the end of discharging phase, the discharged sensing voltage at the sensing node 431 can be represented as voltage $V_{SEN}$. The bit value latched in the sensing latch unit 440 is determined based on the discharged sensing voltage $V_{SEN}$. During the sensing phase (or the strobing phase) following the discharging phase, the latch control circuit is turned on, e.g., by turning on the latch reset transistor with the control signal RO changed to a high level. The first inverter in the sensing latch unit 440 is turned off, e.g., by changing the signal POS0 for the first inverter to a high level. The second inverter (e.g., the second inverter 524 of FIG. 5) in the sensing latch unit 440 can be on, so that the bit values at the DL node and the DLB node are opposite.

When a memory cell coupled to the bit line 401 stores bit "1", the voltage $V_{SEN}$ can be smaller than (or equal to) a threshold voltage, e.g., $V_{Strobe}$, and the sensing transistor 432 is turned off. Thus, the bit value "1" at the DL node is kept unchanged, which corresponds to the bit "1" stored in the memory cell.

When the memory cell coupled to the bit line stores bit "0", the voltage $V_{SEN}$ can be greater than the threshold voltage, which can turn on the sensing transistor 432. As illustrated in FIG. 6C and STEP 3 in FIG. 7, as the latch reset transistor is turned on, and the high voltage corresponding to the bit value "1" at the DL node is discharged to a low voltage corresponding to the bit value "0" along a current path 652. Accordingly, the bit value "0" at the DLB node is changed to a bit value "1" via the second inverter in the sensing latch unit 440. Thus, the bit value "0" at the DL node in the latch of the sensing latch unit 440 is updated to correspond to the bit "0" stored in the memory cell.

In some implementations, the storage latch circuit 450 is configured to turn on one or more latch control circuits of the storage latch units 460 to write a sensing result in one or more latches of the storage latch units 460, e.g., during the sensing phase or a storing phase following the sensing phase. For example, to store the sensing result "0", the latch control circuit (e.g., the latch control circuit 530 of FIG. 5) in the storage latch unit 460 is turned on, e.g., by changing the control signal S2 from a low voltage level to a high voltage level. As the sensing voltage is higher than the threshold voltage, a voltage corresponding to a bit value "0" at the L1B node in the latch of the storage latch unit 460 is pulled high to a voltage corresponding to a bit value "1", and the voltage corresponding to a bit value "1" at the L1 node in the latch of the storage latch unit 460 is pulled down to a voltage corresponding to the bit value "0".

Figure 8:
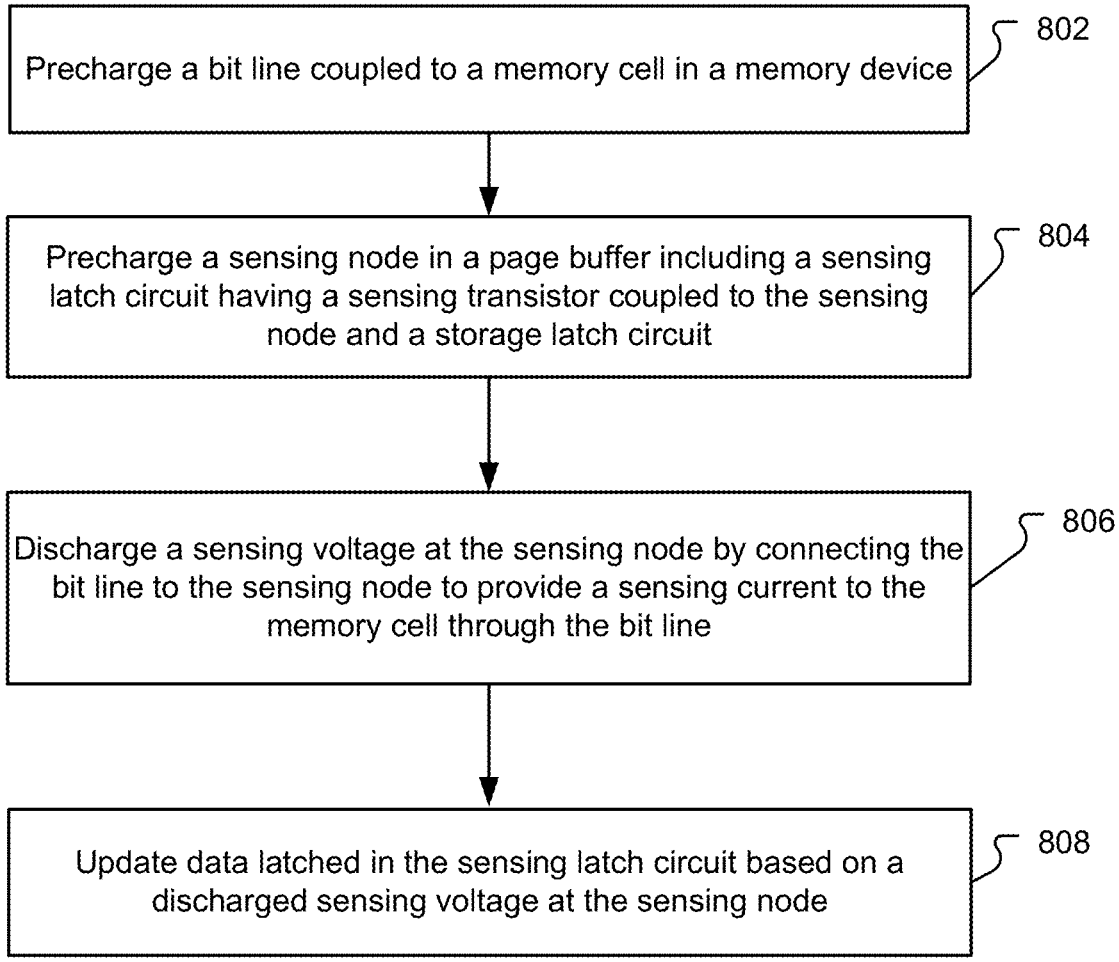
FIG. 8 is a flow chart of an example process for managing a page buffer in a memory device, according to one or more implementations of the present disclosure.

FIG. 8 illustrates an example of a process 800 for managing a page buffer circuit in a memory device, according to one or more implementations of the present disclosure. The memory device can be the memory 116 of FIG. 1A or the memory device 200 of FIG. 2. The memory device can include a memory cell array having a number of memory cells, e.g., memory cells 141 of FIG. 1B or 157 of FIG. 1C. The memory cells are connected in series in columns with a number of memory cell lines (e.g., bit lines). The page buffer circuit can be the page buffer circuit 220 of FIG. 2. The page buffer circuit includes a number of page buffers, e.g., the page buffer 222 of FIG. 2 or the page buffer 400 of FIG. 4. Each page buffer is coupled to a corresponding memory cell through a corresponding bit line. Each page buffer can be managed or controlled by a control logic, e.g., the control logic 204 of FIG. 2, in the memory device. The process 800 can be performed by the control logic managing the page buffer.

The page buffer includes a sensing latch circuit (e.g., the sensing latch circuit 430 of FIG. 4) and a storage latch circuit (e.g., the storage latch circuit 450 of FIG. 4). The sensing latch circuit includes a sensing transistor (e.g., the sensing transistor 432 of FIG. 4) coupled to a sensing node (e.g., the sensing node 431 of FIG. 4) and at least one sensing latch unit (e.g., the sensing latch unit 440 of FIG. 4). The at least sensing latch unit has a first node coupled to the sensing node and a second node coupled to the sensing transistor. The storage latch circuit includes at least one storage latch unit (e.g., the storage latch unit 460 of FIG. 4) having third and fourth nodes coupled to the sensing node. The sensing transistor includes a first terminal (e.g., a drain terminal) coupled to the second node of the at least one sensing latch unit, a gate terminal coupled to the sensing node and the third and fourth nodes of the at least one storage latch unit, and a second terminal (e.g., a source terminal) coupled to a ground.

The sensing latch circuit and the storage latch circuit can be configured to have an operational sensing capacitor (or an equivalent capacitor) that is associated with a gate capacitor (e.g., the gate capacitor 408 of FIG. 4) associated with the sensing transistor and one or more parasitic junction capacitors (e.g., the junction capacitor 406 of FIG. 4) in the sensing latch circuit and the storage latch circuit. The operational sensing capacitor can be also associated with one or more metal routing lines in the sensing latch circuit and the storage latch circuit. A gate capacitor can have a larger capacitance variance close to a threshold voltage than a junction capacitor.

In some embodiments, the storage latch circuit includes no sensing transistor. The sensing latch circuit includes only one sensing transistor. In some embodiments, the sensing latch circuit includes a plurality of sensing transistors and a plurality of sensing latch units, and a number of the plurality of sensing transistors is smaller than a number of the plurality of sensing latch units.

A sensing latch unit and a storage latch unit can have a same type of latch unit, e.g., the latch unit 500 of FIG. 5. In some embodiments, each of the at least one sensing latch unit includes a first latch (e.g., the latch 520 of FIG. 5) having a first pair of inverters (e.g., the inverters 522 and 524 of FIG. 5), a first latch control circuit (e.g., the latch control circuit 530 of FIG. 5) coupled to the first latch and the first terminal of the sensing transistor. Each of the at least one sensing latch unit can further include a first coupling circuit (e.g., the coupling circuit 510 of FIG. 5) coupled to the sensing node and the first latch.

In some embodiments, each of the at least one storage latch unit includes: a second latch (e.g., the latch 520 of FIG. 5) having a second pair of inverters (e.g., the inverters 522 and 524 of FIG. 5) and a second latch control circuit (e.g., the latch control circuit 530 of FIG. 5) coupled to the second latch and the gate terminal of the sensing transistor. Each of the at least one storage latch unit can further include a second coupling circuit (e.g., the coupling circuit 510 of FIG. 5) coupled to the sensing node and the second latch.

In some embodiments, the at least one sensing latch unit includes a first type of latch, and the at least one storage latch unit includes a second type of latch that is different from the first type of latch. One of the first type of latch and the second type of latch can be a triple-state latch or a fighting latch. The first type of latch can be different from the second type of latch.

In some embodiments, the page buffer further includes a precharging circuit (e.g., the precharging circuit 410 of FIG. 4) coupled to the sensing node and a bit line control circuit (e.g., the bit line control circuit 402 of FIG. 4) having a first control node coupled to the bit line and a second control node coupled to the sensing node. The page buffer can further include a discharging circuit, the discharging circuit 402 of FIG. 4, coupled to the bit line control circuit.

In some embodiments, a number of the at least one sensing latch unit in the sensing latch circuit and a number of the at least one storage latch unit in the storage latch circuit are associated with a memory cell type of the memory cells. The number of the at least one storage latch unit in the storage latch circuit can be determined based on a number of bits stored in the memory cell type. The sensing latch circuit can include two or more sensing latch units, e.g., for quick pass write (QPW) operations.

In some examples, the memory cell type of the memory cells is a single-level cell (SLC) type, and the sensing latch circuit includes one sensing latch unit and the storage latch circuit includes one storage latch unit. In some examples, the memory cell type of the memory cells is a multi-level cell (MLC) type, and the sensing latch circuit includes one sensing latch unit and the storage latch circuit includes two storage latch units. In some examples, the memory cell type of the memory cells is a triple-level cell (TLC) type, and the sensing latch circuit comprises two sensing latch units and the storage latch circuit comprises three storage latch units. In some examples, the memory cell type of the memory cells is a quad-level cell (QLC) type, and the sensing latch circuit includes two sensing latch units and the storage latch circuit includes four storage latch units.

During a precharging phase, a bit line coupled to a memory cell in the memory device is precharged by the page buffer corresponding to the bit line (802). For example, as illustrated in FIG. 6A and FIG. 7, the bit line control circuit can be turned on to precharge the bit line along a current path, e.g., the current path 604 of FIG. 6A. The bit line control circuit can include a number of transistors, e.g., the transistors 422, 424, 426, 427, 428 of FIG. 4. The bit line control circuit can be turned on by turning on transistor 426 with a control signal BLC2 and transistor 424 with a control signal. The bit line control circuit is configured to disconnect the bit line to the sensing node, e.g., by keeping the transistor 428 off.

During the precharging phase, the sensing node in the sensing latch circuit of the page buffer is precharged (804). For example, as illustrated in FIG. 6A and FIG. 7, the precharging circuit in the page buffer is turned on to form a current path, e.g., the current path 602 of FIG. 6A, to charge the sensing node to a predetermined sensing voltage. The precharging circuit can be turned on by turning on a transistor (e.g., the transistor 414 of FIG. 4) coupled to the sensing node with a precharging enable signal PSEN.

During a discharging phase following the precharging phase, the predetermined sensing voltage at the sensing node is discharged by connecting the bit line to the sensing node to provide a sensing current to the memory cell through the bit line (806). For example, as illustrated in FIG. 6B and FIG. 7, the precharging circuit is turned off to stop charging the sensing node, e.g., by turning off the transistor coupled to the sensing node. The sensing node is conductively connected to the bit line, e.g., by turning on the transistor 428 in the bit line control circuit. The predetermined sensing voltage can be larger than a bit line voltage. Thus, a current path, e.g., the current path 632, can be formed to discharging the sensing voltage at the sensing node. At the end of the discharging phase, the discharged sensing voltage can be decreased to a voltage $V_{SEN}$.

During a sensing phase following the discharging phase, data latched in the sensing latch circuit is updated based on a discharged sensing voltage at the sensing node (808). For example, as illustrated in FIGS. 6C and 7, the data latched in the sensing latch circuit can be a bit value "1" at a node (e.g., the DL node) of the latch in the sensing latch circuit and a bit value "0" at a node (e.g., the DLB node) of the latch in the sensing latch circuit. During the sensing phase, the latch control circuit in the sensing latch circuit is turned on.

In some examples, if the memory cell stores a bit "1", the discharged sensing voltage $V_{SEN}$ is smaller than (or equal to) the threshold voltage (e.g., $V_{Strobe}$ of FIG. 7), the sensing transistor is turned off, and the bit value "1" latched in the latch of the sensing latch circuit is kept unchanged, which corresponds to the bit "1" stored in the memory cell.

In some examples, if the memory cell stores a bit "0", the discharged sensing voltage $V_{SEN}$ is greater than the threshold voltage, the sensing transistor is turned on, and the bit value "1" latched in the sensing latch circuit is changed to a bit value "0," which corresponds to the bit "0" stored in the memory cell.

In some implementations, during the sensing phase or a storing phase following the sensing phase, the storage latch circuit is configured to turn on one or more latch control circuits to write a sensing result in one or more latches of the storage latch circuit. In some implementations, data latched in the storage latch circuit is further cached in a cache data latch (CDL) circuit, e.g., the CDL circuit 230 of FIG. 2.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory device comprising:
    a memory cell array comprising a plurality of memory cells;
    a plurality of memory cell lines connecting respective lines of memory cells in the memory cell array; and
    a page buffer circuit comprising a plurality of page buffers coupled to the plurality of memory cell lines, each page buffer comprising:
        a sensing latch circuit comprising a sensing transistor coupled to a sensing node and at least one sensing latch unit having a first node coupled to the sensing node and a second node coupled to the sensing transistor, and
        a storage latch circuit comprising at least one storage latch unit having third and fourth nodes coupled to the sensing node,
        wherein the sensing transistor comprises a first terminal coupled to the second node of the at least one sensing latch unit, a gate terminal coupled to the sensing node and the third and fourth nodes of the at least one storage latch unit, and a second terminal coupled to a ground, and
        wherein the sensing latch circuit comprises one or more sensing transistors that each are substantially same as the sensing transistor, wherein the sensing latch circuit comprises a plurality of sensing latch units, and wherein a number of the one or more sensing transistors is smaller than a number of the plurality of sensing latch units.

2. The memory device of claim 1, wherein:
    each of the at least one sensing latch unit comprises:
        a first latch having a first pair of inverters; and
        a first latch control circuit coupled to the first latch and the first terminal of the sensing transistor, and
    each of the at least one storage latch unit comprises:
        a second latch having a second pair of inverters; and
        a second latch control circuit coupled to the second latch and the gate terminal of the sensing transistor.

3. The memory device of claim 2, wherein the second latch control circuit comprises a first control transistor and a second control transistor, and
    wherein source terminals of the first control transistor and the second control transistor are coupled to the sensing node and the gate terminal of the sensing transistor.

4. The memory device of claim 1, wherein:
    each of the at least one sensing latch unit comprises a first latch and a first coupling circuit that is coupled between the sensing node and the first latch, and
    each of the at least one storage latch unit comprises a second latch and a second coupling circuit that is coupled between the sensing node and the second latch.

5. The memory device of claim 1, wherein each page buffer further comprises:
    a precharging circuit coupled to the sensing node and configured to precharge the sensing node during a precharging phase; and
    a bit line control circuit having a first control node coupled to a bit line for a memory cell and a second control node coupled to the sensing node,
    wherein the bit line control circuit is configured to:
        precharge the bit line during the precharging phase and
        discharge the sensing node by conductively connecting the sensing node with the bit line to provide a sensing current to the memory cell during a discharging phase sequential to the precharging phase.

6. The memory device of claim 5, wherein the storage latch circuit is configured to:
    turn on one or more latch control circuits of the at least one storage latch unit to update a sensing result in one or more latches of the at least one storage latch unit.

7. The memory device of claim 1, wherein a number of the at least one sensing latch unit in the sensing latch circuit and a number of the at least one storage latch unit in the storage latch circuit are associated with a memory cell type of the memory cells.

8. The memory device of claim 1, wherein the storage latch circuit comprises no transistor substantially same as the sensing transistor.

9. An integrated circuit comprising:
    a sensing latch circuit comprising:
        a sensing transistor coupled to a sensing node;
        at least one sensing latch unit having a first node coupled to the sensing node and a second node coupled to the sensing transistor; and
    a storage latch circuit comprising:
        at least one storage latch unit having third and fourth nodes coupled to the sensing node,
    wherein the sensing transistor comprises:
        a first terminal coupled to the second node of the at least one sensing latch unit,
        a second terminal coupled to a ground, and
        a gate terminal coupled to the sensing node and the third and fourth nodes of the at least one storage latch unit,
    wherein the at least one sensing latch unit comprises a plurality of sensing latch units, and each of the plurality of sensing latch units comprises a respective first node coupled to the sensing node and a respective second node coupled to the first terminal of the sensing transistor, and wherein the at least one storage latch unit comprises a plurality of storage latch units, and wherein each of the plurality of storage latch units comprises a respective third node coupled to the sensing node and a respective fourth node coupled to the gate terminal of the sensing transistor.

10. The integrated circuit of claim 9, wherein:
each of the at least one sensing latch unit comprises:
a first latch having a first pair of inverters; and
a first latch control circuit coupled to the first latch and the first terminal of the sensing transistor, and
each of the at least one storage latch unit comprises:
a second latch having a second pair of inverters; and
a second latch control circuit coupled to the second latch and the gate terminal of the sensing transistor.

11. The integrated circuit of claim 10, wherein:
each of the at least one sensing latch unit comprises:
a first coupling circuit coupled to the sensing node and the first latch, and
each of the at least one storage latch unit comprises:
a second coupling circuit coupled to the sensing node and the second latch.

12. The integrated circuit of claim 9, wherein the sensing latch circuit comprises at least one sensing transistor, and the at least one storage latch unit comprises no transistor substantially same as the sensing transistor.

13. The integrated circuit of claim 9, wherein the sensing latch circuit and the storage latch circuit are configured to have an equivalent capacitor that is associated with a gate capacitor associated with the sensing transistor and one or more junction capacitors associated with transistors in the sensing latch circuit and the storage latch circuit.

14. The integrated circuit of claim 9, further comprising:
a precharging circuit coupled to the sensing node and configured to precharge the sensing node during a precharging phase; and
a bit line control circuit having a first control node coupled to a bit line for a memory cell and a second control node coupled to the sensing node,
wherein the bit line control circuit is configured to precharge the bit line during the precharging phase and discharge the sensing node by conductively connecting the sensing node with the bit line to provide a sensing current to the memory cell during a discharging phase sequential to the precharging phase.

15. The integrated circuit of claim 14, wherein the sensing latch circuit is configured such that:
when the memory cell stores bit "0", a sensing voltage at the sensing node is greater than a threshold voltage, and the sensing transistor is turned on to change a bit value latched in the at least one sensing latch unit to "0" and
when the memory cell stores bit "1", the sensing voltage at the sensing node is smaller than or equal to the threshold voltage, and the sensing transistor is turned off to maintain the bit value latched in the at least one sensing latch unit to "1", and
wherein the storage latch circuit is configured to:
turn on one or more latch control circuits of the at least one storage latch unit to update a sensing result in one or more latches of the at least one storage latch unit.

16. The integrated circuit of claim 9, wherein the at least one sensing latch unit comprises a first type of latch, and the at least one storage latch unit comprises a second type of latch that is different from the first type of latch.

17. An integrated circuit comprising:
a first latch circuit comprising a sensing transistor coupled to a sensing node and one or more first latch units coupled to the sensing transistor; and
a second latch circuit coupled to the sensing node, the second latch circuit comprising one or more second latch units, each of the one or more second latch units being same as each of the one or more first latch units,
wherein the sensing transistor is different from each transistor in the second latch circuit in that the sensing transistor has a gate terminal coupled to the sensing node and functions as a gate capacitor,
wherein the one or more first latch unit comprises a plurality of first latch units, and each of the plurality of first latch units comprises a respective first node coupled to the sensing node and a respective second node coupled to a drain or source terminal of the sensing transistor, and
wherein the one or more second latch unit comprises a plurality of second latch units, and wherein each of the plurality of second latch units comprises a respective third node coupled to the sensing node and a respective fourth node coupled to the gate terminal of the sensing transistor.

18. The integrated circuit of claim 17, further comprising:
a third circuit configured to:
during a first phase, separately precharge the sensing node and a bit line that is coupled to a memory cell in a memory device and configured to be disconnected from the sensing node, and
during a second phase after the first phase, discharge a sensing voltage at the sensing node according to an equivalent capacitor by conductively connecting the sensing node to the bit line to generate a sensing current to the memory cell through the bit line, wherein the equivalent capacitor is based on the gate capacitor associated with the sensing transistor and one or more junction capacitors associated with one or more first transistors in the one or more first latch units and one or more second transistors in the one or more second latch units, and wherein a total capacitance of the one or more junction capacitors is substantially larger than a capacitance of the gate capacitor,
wherein the first latch circuit is configured to:
after the second phase, update data latched in the first latch circuit based on a discharged sensing voltage at the sensing node, and
wherein the second latch circuit is configured to:
turn on at least one of the one or more second transistors to update the data latched in the first latch circuit into at least one latch in the second latch circuit.

19. The memory device of claim 1, wherein each of the plurality of sensing latch units comprises a respective first node coupled to the sensing node and a respective second node coupled to the first terminal of the sensing transistor, and
wherein the at least one storage latch unit comprises a plurality of storage latch units, and wherein each of the plurality of storage latch units comprises a respective third node coupled to the sensing node and a respective fourth node coupled to the gate terminal of the sensing transistor.

20. The integrated circuit of claim 9, wherein the sensing latch circuit comprises one or more sensing transistors that each are substantially same as the sensing transistor, and wherein a number of the one or more sensing transistors is smaller than a number of the plurality of sensing latch units.

* * * * *